(12) United States Patent
Bendett et al.

(10) Patent No.: US 6,970,494 B1
(45) Date of Patent: Nov. 29, 2005

(54) RARE-EARTH DOPED PHOSPHATE-GLASS LASERS AND ASSOCIATED METHODS

(75) Inventors: Mark P. Bendett, Plymouth, MN (US); Norman A. Sanford, Boulder, CO (US); David L. Veasey, Boulder, CO (US)

(73) Assignees: Teem Photonics, S.A., Meylan Cedex (FR); The United States of America as represented by the Secretary of Commerce, Washington, DC (US)

( * ) Notice: Subject to any disclaimer, the term of this patent is extended or adjusted under 35 U.S.C. 154(b) by 0 days.

(21) Appl. No.: 09/490,748

(22) Filed: Jan. 25, 2000

Related U.S. Application Data

(60) Provisional application No. 60/162,458, filed on Oct. 29, 1999, provisional application No. 60/117,477, filed on Jan. 27, 1999.

(51) Int. Cl.[7] .............................................. H01S 3/08
(52) U.S. Cl. .......................... 372/102; 372/19; 372/22; 372/18
(58) Field of Search ............................ 372/102, 18, 19

(56) References Cited

U.S. PATENT DOCUMENTS

| | | | |
|---|---|---|---|
| 2,110,237 A | 3/1938 | Parsons | 23/258 |
| 2,182,564 A | 12/1939 | Leiboff | 167/74 |
| 3,481,712 A | 12/1969 | Bernstein et al. | 23/292 |
| 3,733,179 A | 5/1973 | Guehler | 23/230 B |
| 3,880,630 A | 4/1975 | Izawa | 65/30 |
| 3,888,648 A | 6/1975 | West et al. | 65/30 |
| 3,912,363 A | 10/1975 | Hammer | 350/96 C |
| 4,039,249 A * | 8/1977 | Kaminow et al. | 385/14 |
| 4,318,058 A | 3/1982 | Mito et al. | 372/50 |
| 4,335,079 A | 6/1982 | Vander Mey | 422/194 |
| 4,659,175 A | 4/1987 | Wilde | 385/91 |
| 4,983,197 A | 1/1991 | Froning et al. | 65/30.13 |

(Continued)

FOREIGN PATENT DOCUMENTS

EP  0784362  7/1997  ............. H01S 3/06

(Continued)

OTHER PUBLICATIONS

Barbier, D., et al., "Sub-Centimeter length ion-exchanged waveguide lasers in Er/Yb doped phosphate glass", *11th Ann. Conf. on Integrated Optics and Optical Fibre Comm.*, vol. 4, pp. 41-44, (1997).

(Continued)

*Primary Examiner*—Minsun Oh Harvey
*Assistant Examiner*—Dung Nguyen
(74) *Attorney, Agent, or Firm*—Schwegman, Lundberg, Woessner & Kluth, P.A.

(57) ABSTRACT

Apparatus and method for integrating lasers and optics on glass substrates. An optical (e.g., laser) component formed from a glass substrate doped with a optically active lanthanides species with a plurality of waveguides defined by channels within the substrate. The laser component optionally includes a monolithic array of individual waveguides in which the waveguides form laser resonator cavities with differing resonance characteristics. Another aspect is directed toward pumping the laser wherein a superstrate waveguide cavity, or cladding, Ls positioned adjacent the substrate waveguide for supplying the latter with pump light. A closed crucible processing of optical waveguides on a glass substrate is also described. Waveguides are created by exposing a surface of the substrate to an ion-exchange solvent (e.g., a molten salt). A tightly sealed multi-part crucible is provided in order that gas does not leak in or out of the crucible during cooling or heating of the system.

45 Claims, 15 Drawing Sheets

U.S. PATENT DOCUMENTS

| | | | | |
|---|---|---|---|---|
| 4,986,624 A | | 1/1991 | Sorin et al. | 385/30 |
| 4,993,034 A | * | 2/1991 | Aoki et al. | 372/40 |
| 5,039,190 A | | 8/1991 | Blonder et al. | 359/341 |
| 5,080,503 A | * | 1/1992 | Najafi et al. | 385/1 |
| 5,081,314 A | | 1/1992 | Kissel et al. | 568/479 |
| 5,134,620 A | | 7/1992 | Huber | 372/6 |
| 5,142,660 A | * | 8/1992 | Chang et al. | 385/10 |
| 5,151,908 A | | 9/1992 | Huber | 372/6 |
| 5,242,531 A | | 9/1993 | Klingshirn et al. | 156/620.4 |
| 5,243,609 A | | 9/1993 | Huber | 372/19 |
| 5,295,209 A | * | 3/1994 | Huber | 385/37 |
| 5,311,540 A | * | 5/1994 | Pocholle et al. | 372/97 |
| 5,334,559 A | | 8/1994 | Hayden | 501/48 |
| 5,381,262 A | | 1/1995 | Arima et al. | 359/341 |
| 5,384,797 A | * | 1/1995 | Welch et al. | 372/23 |
| 5,436,919 A | * | 7/1995 | Chwalek et al. | 372/7 |
| 5,473,722 A | | 12/1995 | Sohler et al. | 385/132 |
| 5,491,708 A | | 2/1996 | Malone et al. | 372/41 |
| 5,513,196 A | * | 4/1996 | Bischel et al. | 372/22 |
| 5,519,803 A | | 5/1996 | Shiono et al. | 385/132 |
| 5,526,371 A | | 6/1996 | Shmulovich et al. | 372/68 |
| 5,544,268 A | | 8/1996 | Bischel et al. | 385/4 |
| 5,579,154 A | | 11/1996 | Mueller-Fiedler et al. | 359/341.1 |
| 5,580,471 A | | 12/1996 | Fukumoto et al. | 219/121.63 |
| 5,614,436 A | | 3/1997 | Shim et al. | 438/32 |
| 5,660,611 A | | 8/1997 | Ishikawa et al. | 65/384 |
| 5,677,769 A | | 10/1997 | Bendett | 356/440 |
| 5,677,920 A | | 10/1997 | Waarts et al. | 372/6 |
| 5,703,980 A | | 12/1997 | MacElwee et al. | 385/49 |
| 5,805,755 A | | 9/1998 | Amersfoort et al. | 385/131 |
| 5,858,051 A | | 1/1999 | Komiyama et al. | 65/386 |
| 5,887,097 A | | 3/1999 | Henry et al. | 385/39 |
| 5,915,051 A | | 6/1999 | Damask et al. | 385/16 |
| 5,953,359 A | | 9/1999 | Yamaguchi et al. | 372/50 |
| 6,055,342 A | | 4/2000 | Yi et al. | 385/15 |
| H1848 H | | 5/2000 | Amin et al. | 385/132 |
| 6,101,210 A | | 8/2000 | Bestwick et al. | 372/96 |
| 6,211,980 B1 | | 4/2001 | Terahara | 359/128 |
| 6,304,711 B1 | * | 10/2001 | Samson et al. | 385/142 |
| 6,330,388 B1 | * | 12/2001 | Bendett et al. | 385/132 |
| 6,434,294 B1 | | 8/2002 | Gallo | 385/27 |
| 6,636,678 B1 | | 10/2003 | Bendett et al. | |
| 2001/0009594 A1 | | 7/2001 | Hosoi | 385/2 |
| 2002/0028390 A1 | | 3/2002 | Mazed | 430/5 |
| 2002/0089711 A1 | | 7/2002 | Conzone et al. | 359/109 |
| 2003/0002771 A1 | | 1/2003 | Cheng et al. | 385/14 |

FOREIGN PATENT DOCUMENTS

| | | | |
|---|---|---|---|
| JP | 01042510 | 9/1990 | H01S 3/23 |
| JP | 02222187 | 9/1990 | H01S 3/23 |
| JP | 2222187 | 9/1990 | H01S 3/23 |
| JP | 05-002155 | 1/1993 | G02F 1/035 |
| JP | 60-158407 | 8/1995 | G02B 6/12 |
| WO | 97/44686 | 11/1997 | |

OTHER PUBLICATIONS

Veasey, D.L., et al., "Distributed Feedback Lasers in Rare-earth-doped phosphate glass", (Abstract) *Proceedings of the 7th European Conference on Integrated Optics with Technical Exhibition,* vol. 1, Delft, Netherlands, pp. 579-582, (Apr. 3-6, 1995).

Roman, J.E., et al., "Neodymium-doped glass channel waveguide laser containing an integrated distributed Bragg reflector", *Applied Physics Letters, 61* (23), pp. 2744-2746, (Dec. 7, 1992).

Veasey, D.L., et al., "Arrays of distributed-Bragg-reflector waveguide lasers at 1536 nm in Yb/Er codoped phosphate glass", *Applied Physics Letters, 74* (6), pp. 789-791, (Feb. 8, 1999).

"TIA/EIA Telecommunications Systems Bulletin", *APCO Project 25 System and Standards Definition, TSB102-A (Revision of TSB102),* (1995).

* cited by examiner

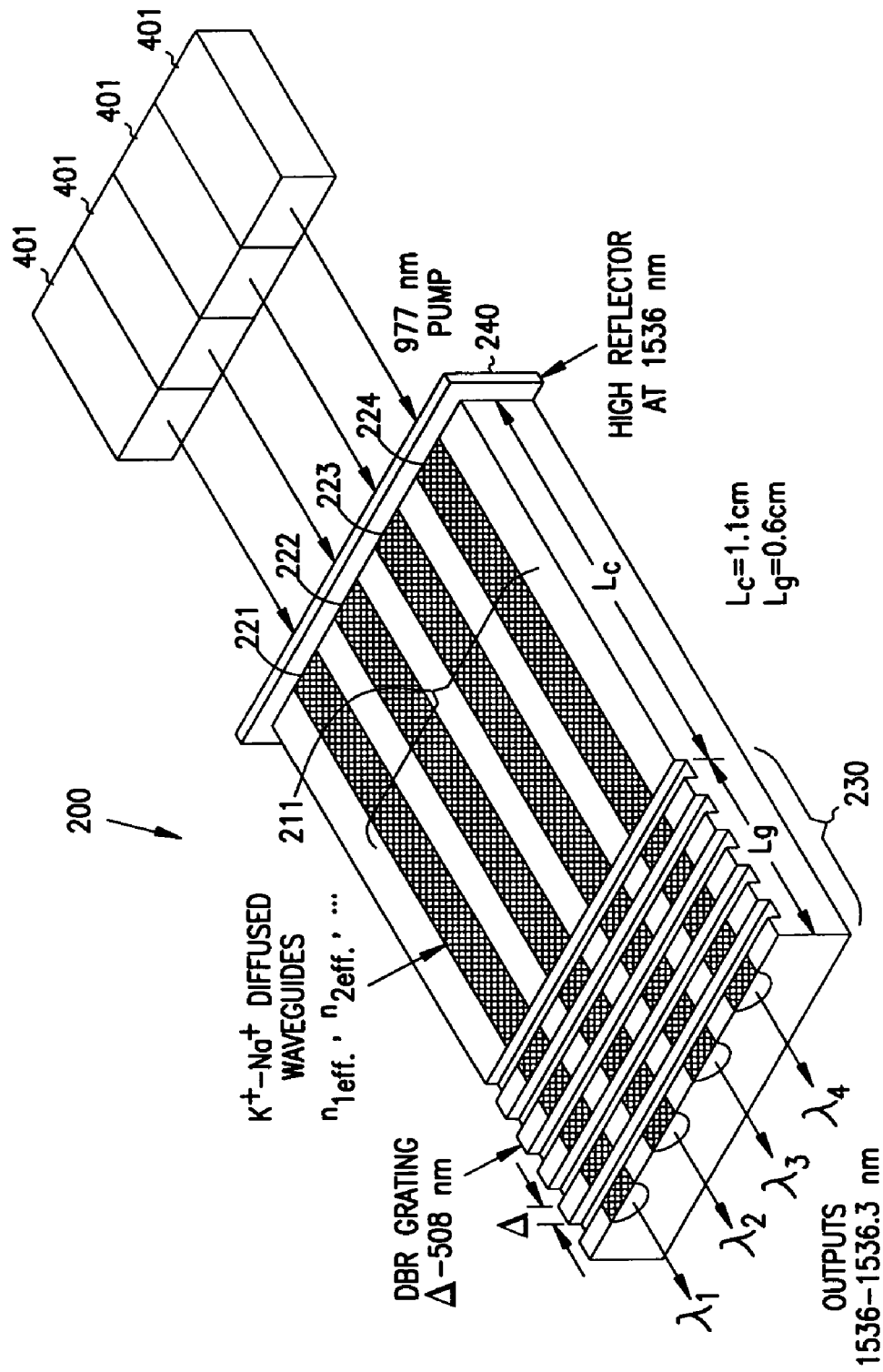
FIG. 1-A1

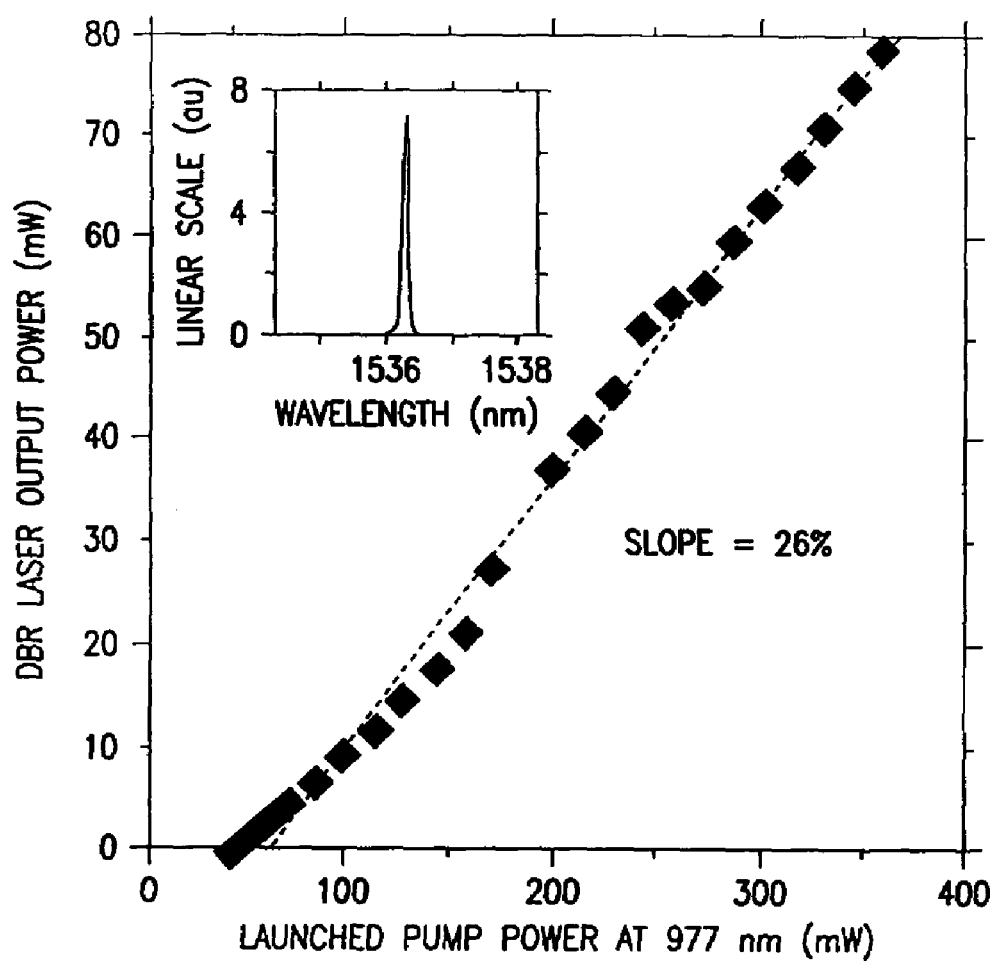
FIG. 1-A2

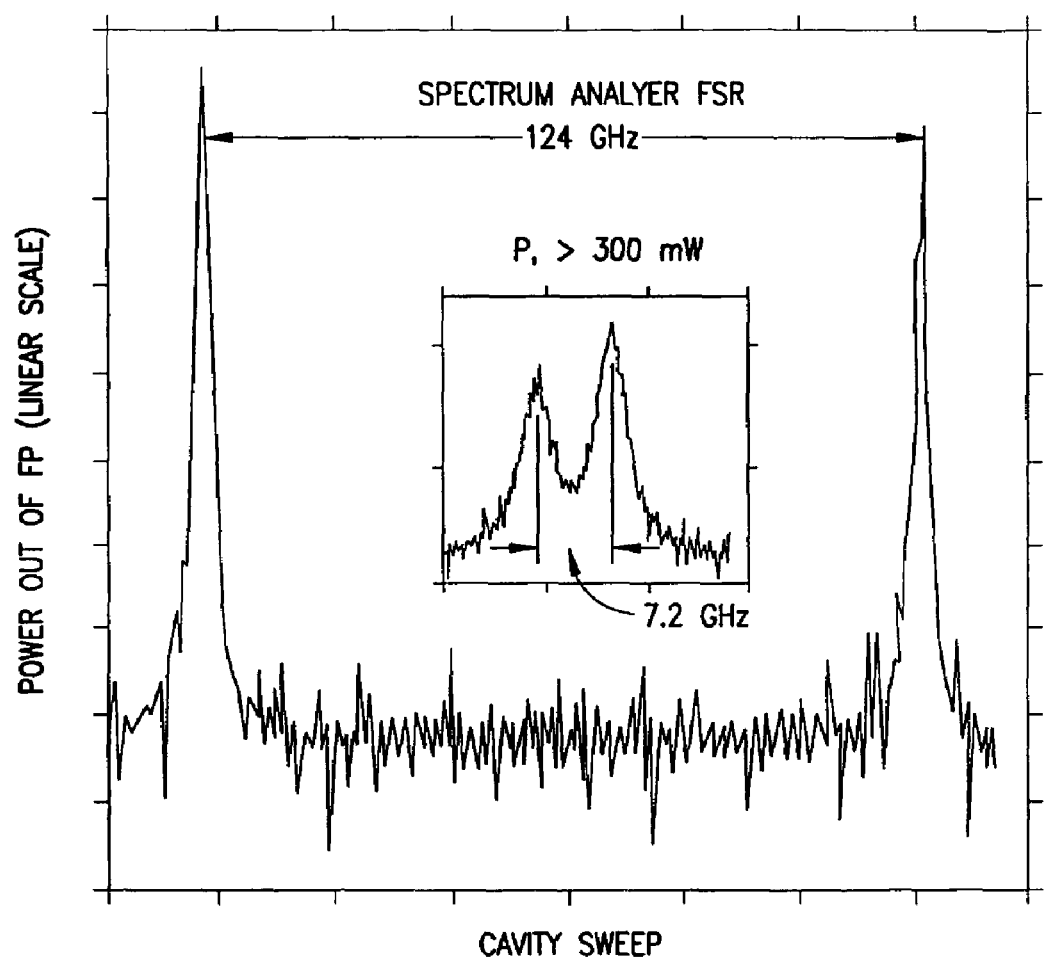
FIG. 1-A3

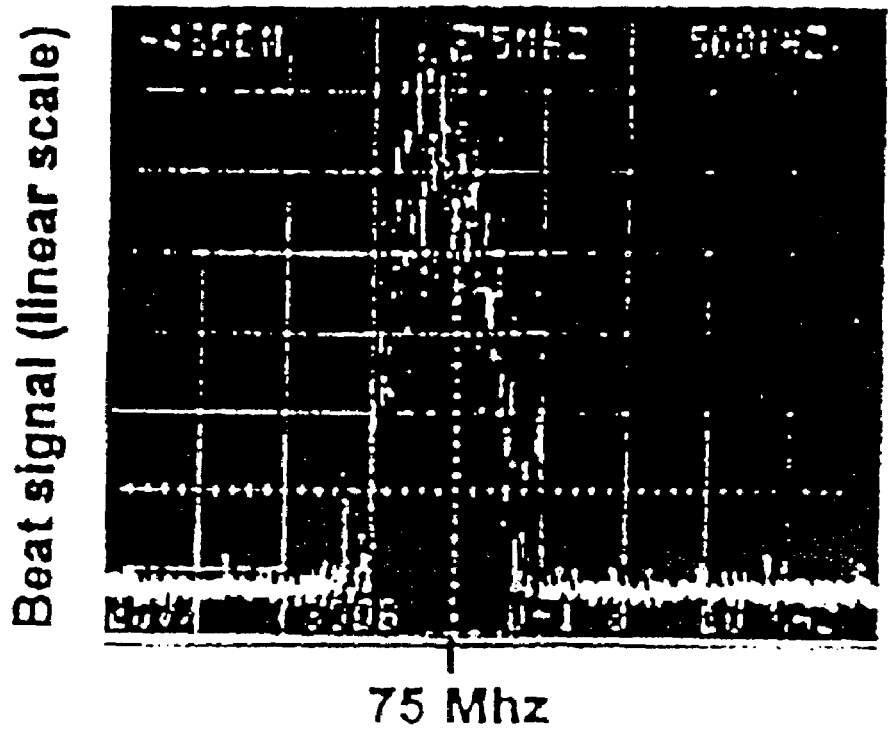
FIG. 1-A4 Frequency (500 kHz/div.)

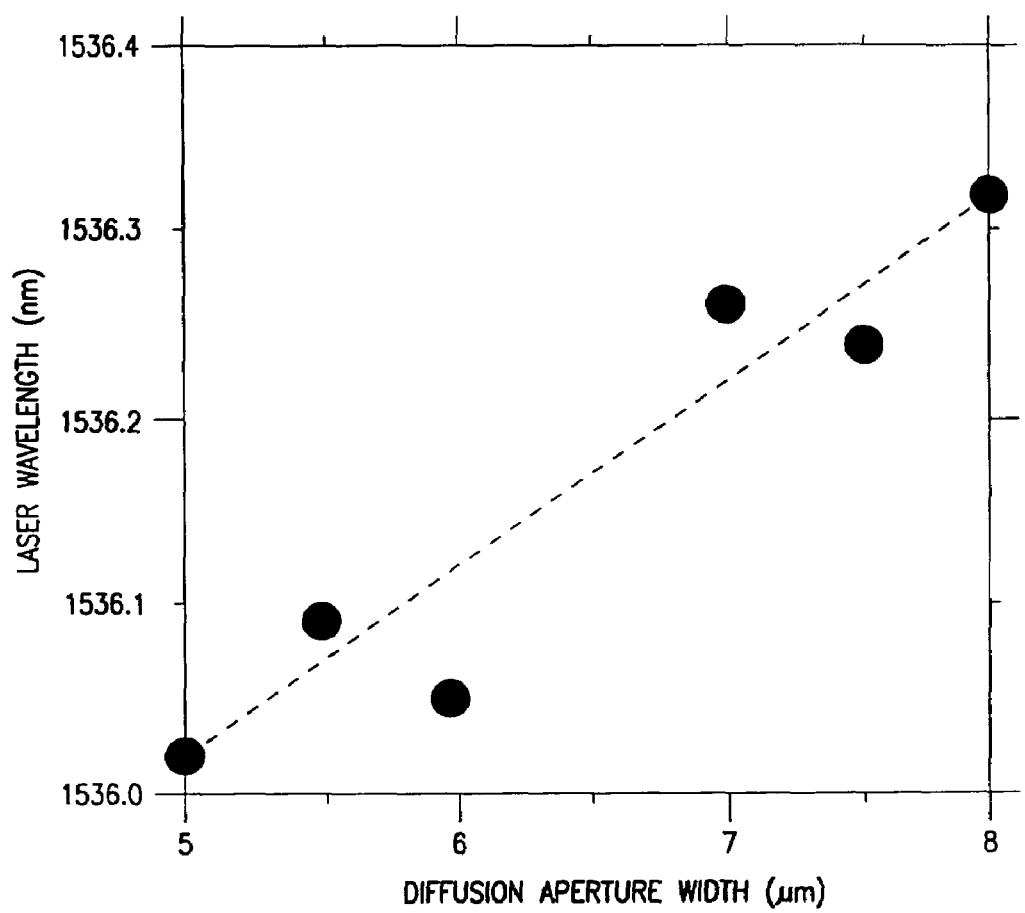
FIG. 1-A5

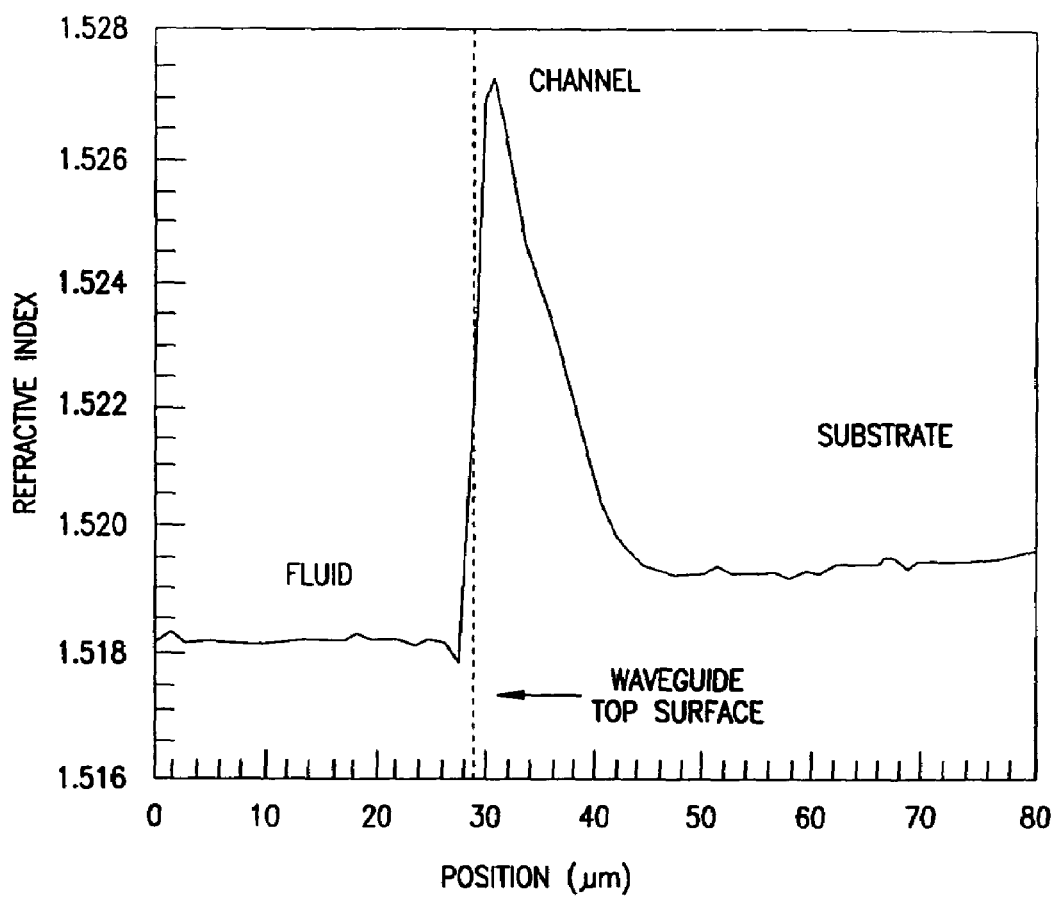
FIG. 1-B1

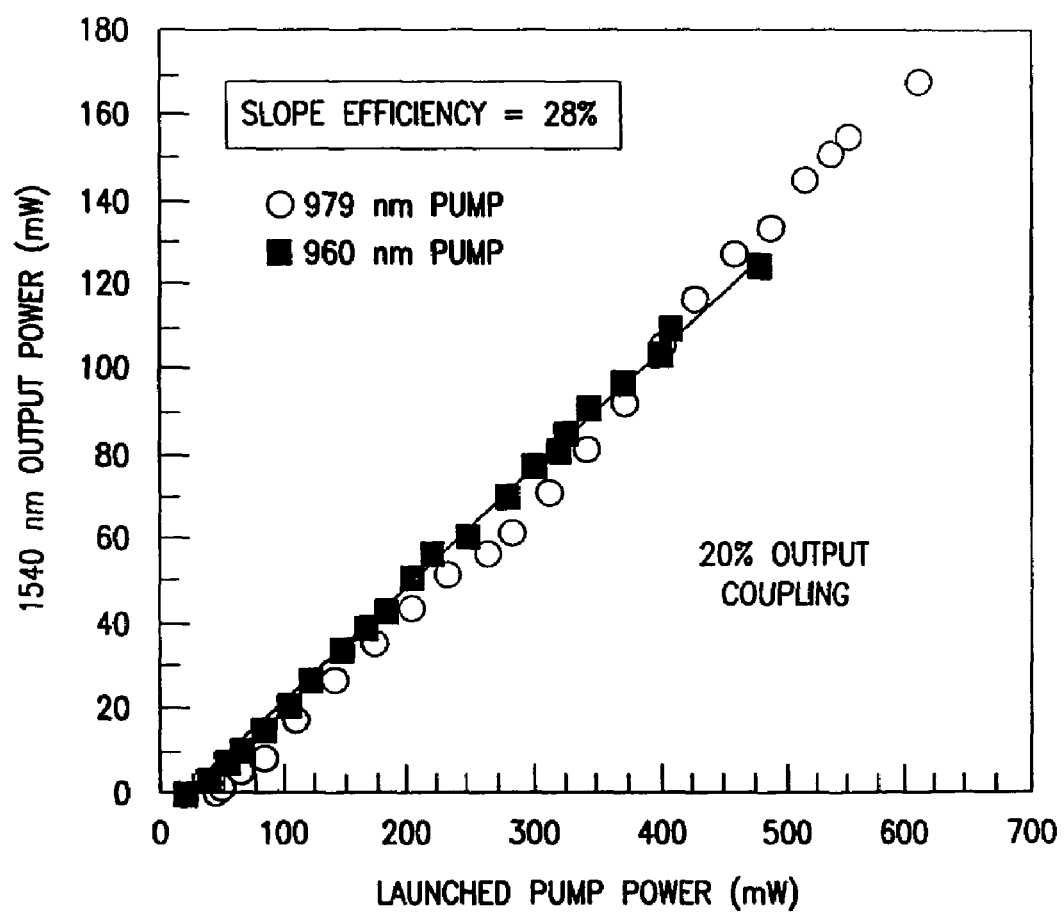
FIG. 1-B2

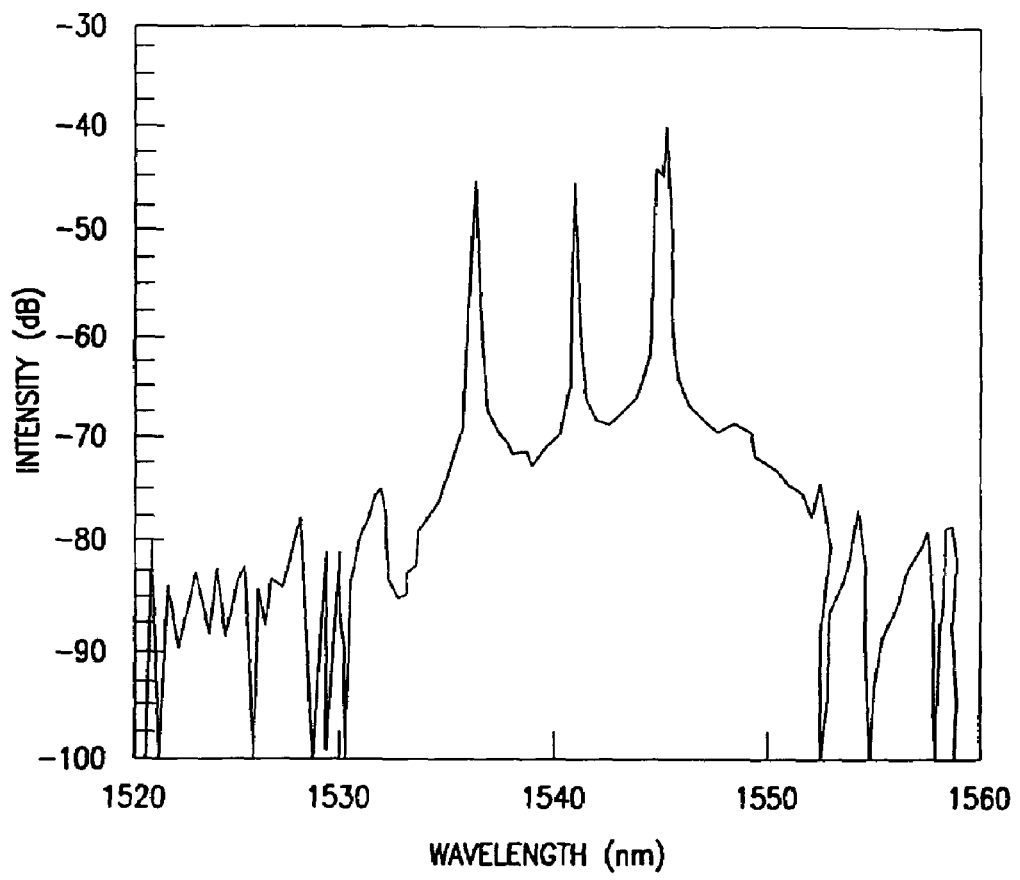
FIG. 1-B3

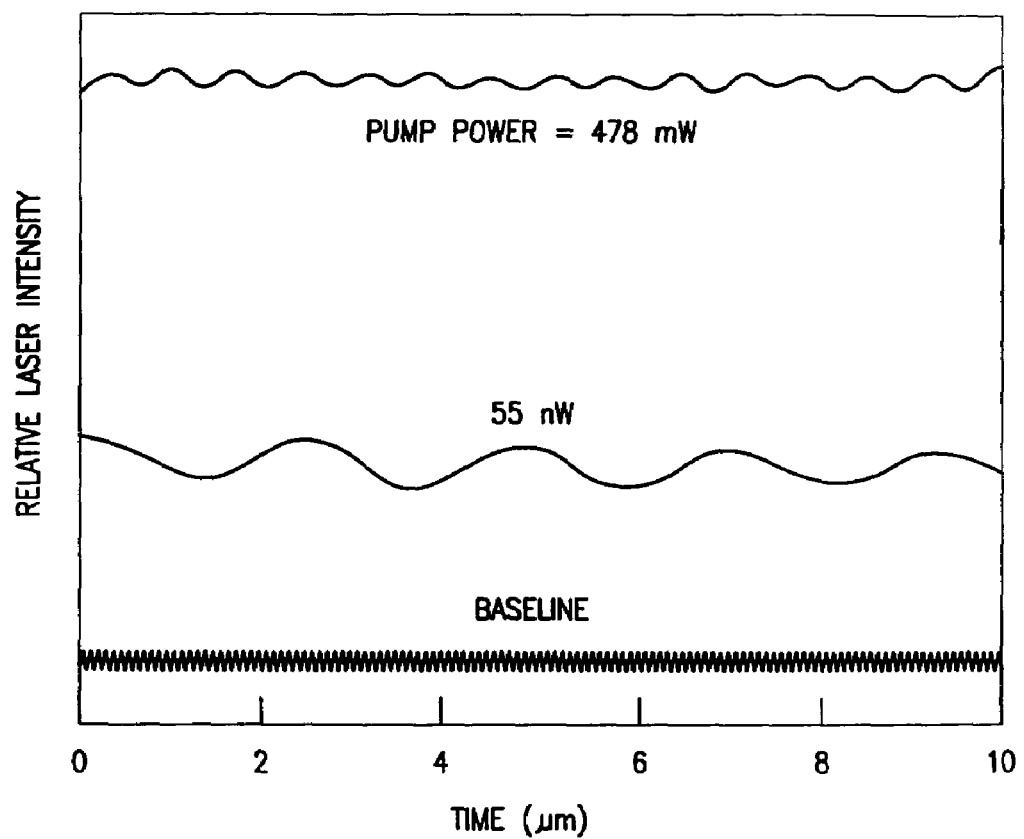
FIG. 1-B4

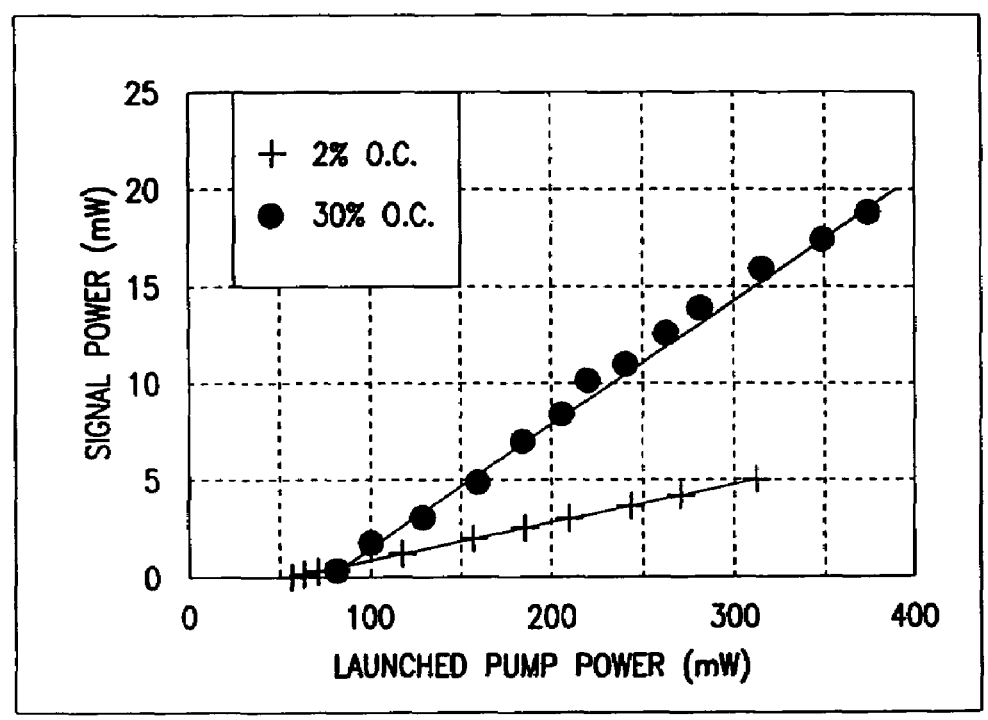
FIG. 1-C1

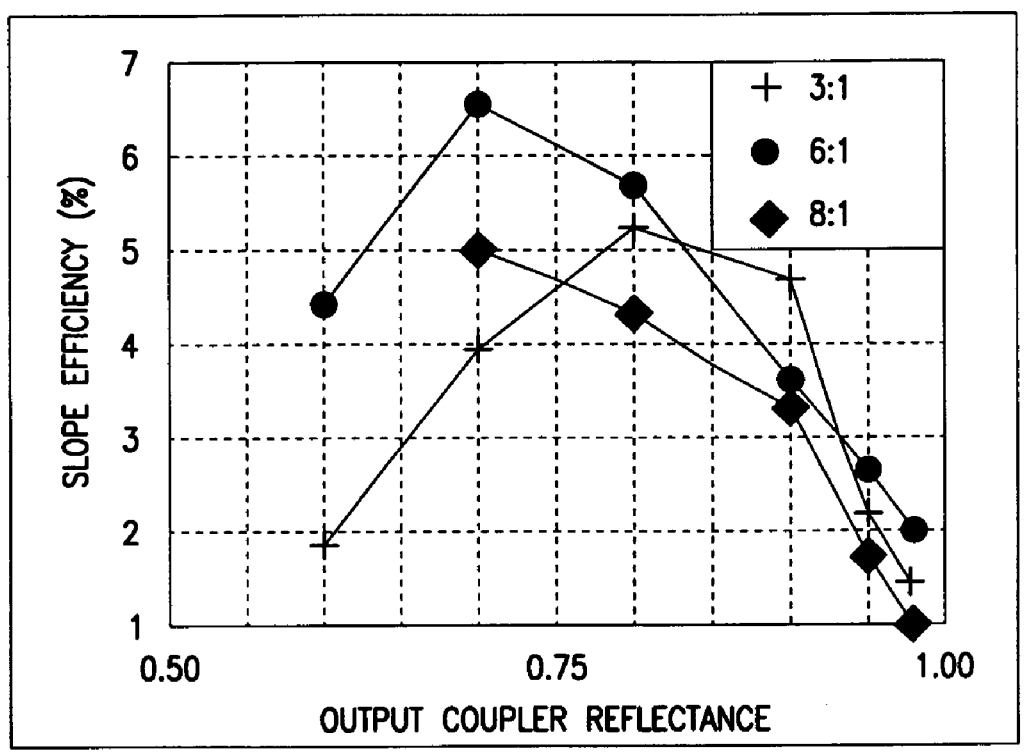
FIG. 1-C2

RARE-EARTH DOPED PHOSPHATE-GLASS LASERS AND ASSOCIATED METHODS

RELATED APPLICATIONS

This application is related to U.S. patent application Ser. No. 09/490,733, entitled METHOD AND APPARATUS FOR CLOSED-CRUCIBLE PROCESSING OF WAVEGUIDE OPTICS filed on even date herewith and U.S. patent application Ser. No. 09/490,730, entitled METHOD AND APPARATUS FOR WAVEGUIDE OPTICS AND DEVICES filed on even date herewith, each of which are incorporated by reference.

This application claims the benefit under 35 U.S.C. 119(e) of U.S. Provisional Application Ser. No. 60/117,477 filed Jan. 27, 1999 and to Provisional Application Ser. No. 60/162,458 filed Oct. 29, 1999, both of which are incorporated by reference.

STATEMENT AS TO RIGHTS TO INVENTIONS MADE UNDER FEDERALLY SPONSORED RESEARCH AND DEVELOPMENT

Certain aspects of these inventions were developed with support from NIST (National Institute for Standards and Technology). The U.S. Government may have rights in certain of these inventions.

FIELD OF THE INVENTION

This invention relates to the field of optics and lasers, and more specifically to a method and apparatus for pumping optical waveguide lasers formed on a glass substrate.

BACKGROUND OF THE INVENTION

The telecommunications industry commonly uses optical fibers to transmit large amounts of data in a short time. One common light source for optical-fiber communications systems is a laser formed using erbium-doped glass. One such system uses erbium-doped glass fibers to form a laser that emits at a wavelength of about 1.536 micrometer and is pumped by an infrared source operating at a wavelength of about 0.98 micrometer. One method usable for forming waveguides in a substrate is described in U.S. Pat. No. 5,080,503 issued Jan. 14, 1992 to Najafi et al., which is hereby incorporated by reference. A phosphate glass useful in lasers is described in U.S. Pat. No. 5,334,559 issued Aug. 2, 1994 to Joseph S. Hayden, which is also hereby incorporated by reference. An integrated optic laser is described in U.S. Pat. No. 5,491,708 issued Feb. 13, 1996 to Malone et al., which is also hereby incorporated by reference.

There is a need in the art for an integrated optical system, including one or more high-powered lasers along with routing and other components, that can be inexpensively mass-produced. The system should be highly reproducible, accurate, and stable.

SUMMARY OF THE INVENTION

The present invention is embodied by a laser component that includes a glass substrate doped with one or more optically active lanthanide species and having a plurality of waveguides defined by channels within the substrate. (As used herein, a "channel within the substrate" is meant to broadly include any channel formed on or in the substrate, whether or not covered by another structure or layer of substrate.) Each substrate waveguide (or "channel") is defined within the substrate as a region of increased index of refraction relative to the substrate. The glass substrate is doped with one or more optically active lanthanide species which can be optically pumped (typically a rare-earth element such as Er, Yb, Nd, or Pr or a combination of such elements such as Er and Yb) to form a laser medium which is capable of lasing at a plurality of frequencies. Mirrors or distributed Bragg reflection gratings may be located along the length of a waveguide for providing feedback to create a laser-resonator cavity. One or more of the mirrors or reflection gratings is made partially reflective for providing laser output.

The laser component may constitute a monolithic array of individual waveguides in which the waveguides of the array form laser resonator cavities with differing resonance characteristics (e.g., resonating at differing wavelengths). The component may thus be used as part of a laser system outputting laser light at a plurality of selected wavelengths. In certain embodiments of the invention, the resonance characteristics of a waveguide cavity are varied by adjusting the width of the channel formed in the substrate which thereby changes the effective refractive index of the waveguide. The effective refractive index can also be changed by modifying the diffusion conditions under which the waveguides are formed as described below. A diffraction Bragg reflector (DBR) grating formed into or close to the waveguide is used, in some embodiments, to tune the wavelength of light supported in the waveguide cavity. Changing the effective refractive index thus changes the effective wavelength of light in the waveguide cavity which determines the wavelengths of the longitudinal modes supported by the cavity. In another embodiment, the resonance characteristics of the waveguide cavities are individually selected by varying the pitch of the DBR reflection gratings used to define the cavities which, along with the effective refractive index for the propagated optical mode, determines the wavelengths of light reflected by the gratings. In still other embodiments, the location of the gratings on the waveguide is varied in order to select a laser-resonator cavity length that supports the desired wavelength of light.

In some embodiments, the laser element is constructed from a glass substrate which is a phosphate alkali glass doped with a rare-earth element such as Er or Yb/Er. The channels defining the waveguides are created by exposing a surface of the substrate to an ion-exchange solvent through a mask layer having a plurality of line apertures corresponding to the channels which are to be formed. The ion exchange may be carried out through an aluminum mask layer in an aluminum or borosilicate glass crucible using molten potassium nitrate as a solvent. Lessened etching of the substrate by the ion-exchange melt has been found to occur in some embodiments that use a tightly sealed aluminum crucible having a graphite gasket between opposing flanges that are tightly bolted together, and having two reservoirs, one for holding the salt melt away from the glass wafers during heating (and later cooling) and another reservoir for holding the salt melt in contact with the glass wafers during ion-exchange processing. In other embodiments, a borosilicate crucible is used and if the potassium nitrate is pre-baked at a temperature of at least 120 degrees C. for 24–48 hours in an inert argon atmosphere. In other embodiments, the crucible is placed inside a fully enclosed chamber during the ion-exchange process, with the chamber filled with an inert atmosphere. Carrying out the ion-exchange process in an enclosed chamber has been found to lessen surface etching due to oxidation reactions. The exchange of K for Na in the substrate produces a channel in the substrate of higher refractive index than the rest of the substrate, thus defining a waveguide. In another particular embodiment, a sodium nitrate electrode is used to carry out electrical field-assisted diffusion of Na ions into the substrate after the K-diffused waveguides are formed. This has the effect of driving the waveguides deeper into the substrate and giving them a more circular cross section. The buried waveguides thus avoid the effects of corrosive processes that result in surface etching.

In one embodiment, a surface-relief grating forming a distributed Bragg reflection grating is fabricated on the surface of the waveguide by coating the surface with photoresist, defining the grating pattern in the photoresist holographically or through a phase mask, developing the photoresist pattern, and etching the grating pattern into the waveguide with a reactive ion system such as an argon ion mill. In certain embodiments, a more durable etch mask allowing more precise etching and higher bias voltages is obtained by depositing chromium on the developed photoresist pattern using an evaporation method which causes the chromium to deposit on the tops of the grating lines.

BRIEF DESCRIPTION OF THE DRAWINGS

FIG. 1-A1 shows an isometric view of a distributed Bragg reflector waveguide laser array realized using a single pitch grating and diffused waveguides with varying effective index.

FIG. 1-A2 shows the single frequency output power at 1536.3 nm as a function of launched 977 nm pump power for a laser described in Example A.

FIG. 1-A3 is a Fabry Perot (FP) interferometer scan of the output of a laser described in Example A showing single frequency operation.

FIG. 1-A4 shows the self heterodyne beat spectrum of a laser in Example A with a 75 MHZ frequency shift.

FIG. 1-A5 shows laser wavelength as a function of waveguide diffusion aperture width for Example A, with data taken using an automatic spectrum analyzer with a resolution of 0.1 nm.

FIG. 1-B1 shows the index depth profile at the center of a waveguide described in Example B.

FIG. 1-B2 shows the output power characteristics of a laser described in Example B for two different pump wavelengths.

FIG. 1-B3 shows the output spectrum of a laser described in Example B.

FIG. 1-B4 shows the output power of the laser described in Example B as a function of time for two pump power levels.

FIG. 1-C1 shows a plot of laser signal power vs. launched pump power for two different output couplers in Example C.

FIG. 1-C2 is plot of slope efficiency vs. output coupler reflectance for each host glass in Example C.

DESCRIPTION OF PREFERRED EMBODIMENTS

Figure 2A:
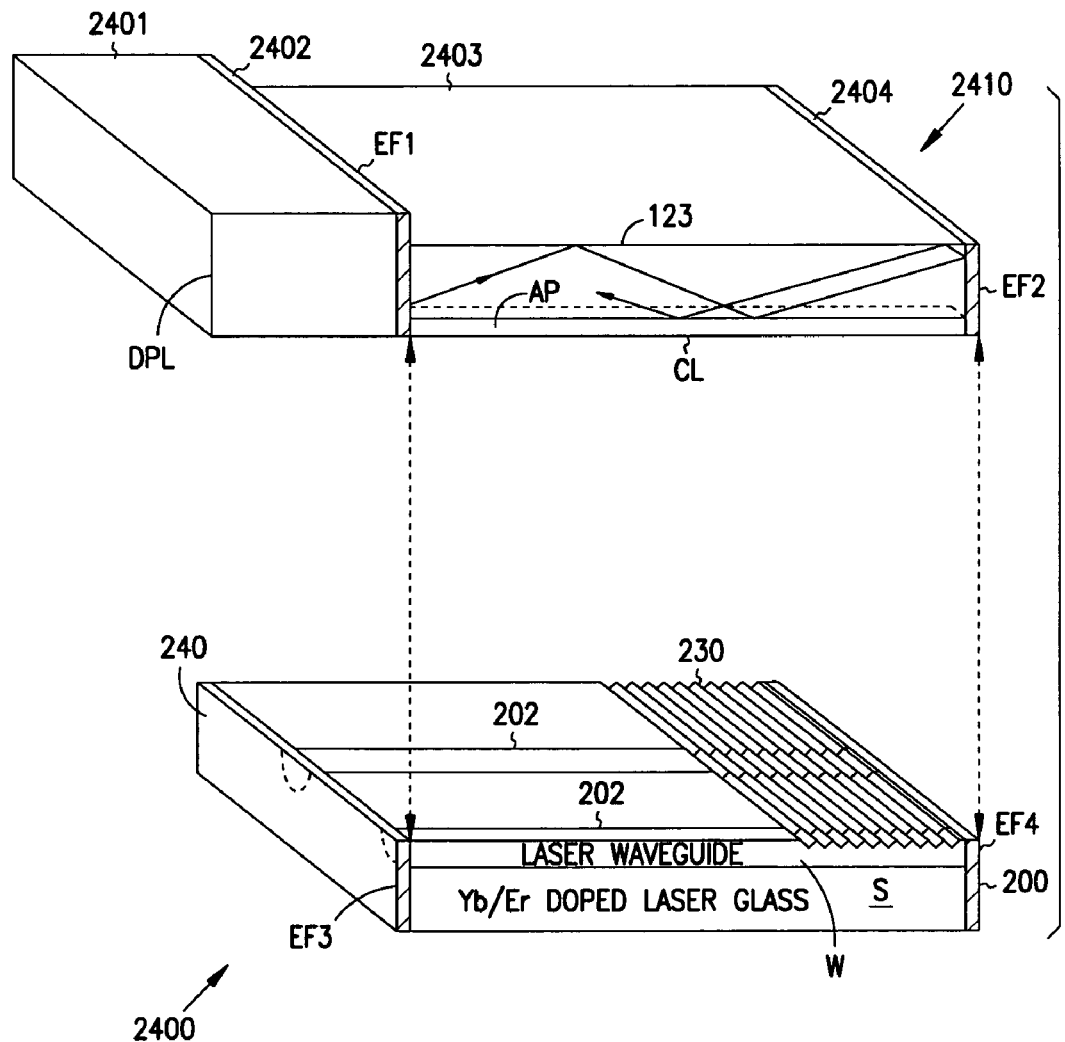
FIG. 2A shows in an exploded view the components of diode pumped laser in accordance with the invention.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The present invention provides a process for forming waveguides onto (or into) the surface of a glass substrate. In one embodiment, photolithographic techniques define waveguides by changing the index of refraction of waveguide channels formed into the surface of the substrate. In one such embodiment, a glass wafer, approximately 10 cm by 10 cm by 1 mm is cut from a slab of IOG-1 laser glass available from Schott Glass Technologies, Inc., of Duryea, Pa., USA. The surfaces of interest, including a "top" major surface (where "top" refers to an orientation in the Figures of this discussion, and not necessarily to an orientation used in the process or operation of the devices) are polished to optical smoothness.

The present invention is embodied by a laser component that includes a glass substrate doped with one or more optically active lanthanide species, or a laser species that is not a lanthanide, and having a plurality of waveguides defined by channels within the substrate. (As used herein, a "channel within the substrate" is meant to broadly include any channel formed on or in the substrate, whether or not covered by another structure or layer of substrate. As used herein, when an embodiment reciting optically active lanthanide species is described, other embodiments may use a laser species that is not a lanthanide.) Each substrate waveguide (or "channel") is defined within the substrate as a region of increased index of refraction relative to the substrate. The glass substrate is doped with one or more optically active lanthanide species which can be optically pumped (typically a rare-earth element such as Er, Yb, Nd, or Pr or a combination of such elements such as Er and Yb) to form a laser medium which is capable of lasing at a plurality of frequencies. Mirrors or distributed Bragg reflection gratings may be located along the length of a waveguide for providing feedback to create a laser-resonator cavity. One or more of the mirrors or reflection gratings is made partially reflective for providing laser output.

The laser component may constitute a monolithic array of individual waveguides in which the waveguides of the array form laser resonator cavities with differing resonance characteristics (e.g., resonating at differing wavelengths). The component may thus be used as part of a laser system outputting laser light at a plurality of selected wavelengths. In certain embodiments of the invention, the resonance characteristics of a waveguide cavity are varied by adjusting the width of the channel formed in the substrate which thereby changes the effective refractive index of the waveguide. The effective refractive index can also be changed by modifying the diffusion conditions under which the waveguides are formed as described below. Changing the effective refractive index thus changes the effective DBR spacings length of the waveguide cavity which in some embodiments determines the wavelengths of the longitudinal modes supported by the cavity. In another embodiment, the resonance characteristics of the waveguide cavities are individually selected by varying the pitch of the reflection gratings used to define the cavities which, along with the effective refractive index of the waveguide under the DBR for the propagated optical mode, determines the wavelengths of light reflected by the gratings. In still other embodiments, the location of the reflectors on the waveguide is varied in order to select a laser-resonator cavity length that supports the desired wavelength of light.

In some embodiments, the laser element is constructed from a glass substrate which is a phosphate alkali glass doped with a rare-earth element such as Er or Yb/Er. In certain various embodiments, Schott glass type IOG1 or IOG10 (available from Schott Glass Technology, Inc. of Duryea, Pa.) is used. In the case of Yb/Er doped glass, maximal lasing efficiency has been found to occur when the Yb/Er ratio is between approximately 3:1 and 8:1 in some embodiments. The channels defining the waveguides are created by exposing a surface of the substrate to an ion-exchange solvent through a mask layer having a plurality of line apertures corresponding to the channels which are to be formed. The ion exchange may be carried out through an aluminum mask layer in an aluminum or borosilicate glass crucible using molten potassium nitrate as a solvent. Lessened etching of the substrate by the ion-exchange melt has been found to occur in some embodiments if a borosilicate crucible is used and if the potassium nitrate is pre-baked at a temperature of at least 120 degrees C. for 24–48 hours in an inert argon atmosphere. In other embodiments, the crucible is placed inside a fully enclosed chamber during the ion-exchange process, with the chamber filled with an inert atmosphere. Carrying out the ion-exchange process in an enclosed chamber has been found to lessen surface etching due to oxidation reactions. The exchange of K for Na in the substrate produces a channel in the substrate of higher refractive index than the rest of the substrate, thus defining a waveguide. In another particular embodiment, a sodium nitrate ion-exchange melt having a pair of electrodes is used to carry out electrical field-assisted diffusion of Na ions into the substrate after the K-diffused waveguides are formed. This has the effect of driving the waveguides deeper into the substrate and giving them a circular cross section. The buried waveguides thus avoid the effects of corrosive processes that result in surface etching.

In one embodiment, a surface-relief grating forming a distributed Bragg reflection grating is fabricated on the surface of the waveguide by coating the surface with photoresist, defining the grating pattern in the photoresist holographically or through a phase mask, developing the photoresist pattern, and etching the grating pattern into the waveguide with a reactive ion system such as an argon ion mill. In some embodiments, an $SiO_2$ layer, approximately 1 to 2 nm (nanometers), is deposited on the glass before the photoresist coating to improve adhesion to the glass. In certain embodiments, a more durable etch mask allowing more precise etching and higher bias voltages is obtained by depositing chromium on the developed photoresist pattern using an evaporation method which causes the chromium to deposit on the tops of the grating lines.

In some embodiments, a collimated laser beam passed through a suitably defined hologram which then transforms collimated laser beam into one or more interference patterns, such as one corresponding to the grating 230 of FIG. 1A1. In yet another embodiment, a suitably defined hologram simultaneously provides one or more other grating patterns as defined herein.

Fabrication and operation of the above devices, parts and/or systems may be better understood with reference to the following non-limiting examples, each of which describe numerous individual embodiments of the present invention. The improved devices output laser power up to and exceeding 170 milliwatts, and provide slope efficiencies of up to and exceeding 26% in various embodiments, far exceeding the output power and slope efficiency of previous devices that lase in the 1.5 micrometer range when pumped in the 0.98 micrometer range. Further, the devices of the present invention provide reproducible and stable output wavelengths, and can be mass produced inexpensively, as compared to previous devices.

EXAMPLE A

An array of monolithic, single-frequency distributed-Bragg-reflector (DBR) waveguide lasers has been successfully demonstrated operating near 1536 nm wavelengths. In this embodiment, lasers 202 were fabricated by forming waveguides 201 in Yb/Er co-doped phosphate glass by ion exchange. The slope efficiency for each laser 202 as a function of launched pump power is 26% and the thresholds occur at 50 mW of launched pump power. An output power of 80 mW was achieved with 350 mW of coupled pump power. Each laser 202 exhibits stable operation on a single longitudinal mode and all have linewidths less than 500 kHz. A comb 211 of waveguides with varying effective indices allows the selection of wavelength using a single-period grating 230 (i.e., a multiple-groove grating having the same groove spacing for all waveguides).

This description is the first reported monolithic, single-frequency distributed-Bragg-reflector (DBR), waveguide lasers in $Yb^{3+}/Er^+$-co-doped phosphate glass. Over the past several years, the growth in the demand for telecommunications bandwidth generated by new telecommunication services, cable television (CATV), and data communication has driven the rapid development of wavelength-division multiplexing (WDM) and dense-wavelength-division multiplexing (DWDM) where information is simultaneously transmitted on several different wavelengths in the same optical fiber channel. The development of WDM systems has placed demands on laser sources that are difficult to meet using conventional technologies such as semiconductor distributed feedback (DFB) lasers. Issues of concern for such systems include wavelength selectivity, wavelength stability over laser lifetime, tunability, process yield, power limitations, and costs.

Integrated, single-frequency, solid-state lasers using the $Er^{3+}$ ion offer a very promising and competitive alternative to DFB lasers for use in future WDM communications systems and for optically-distributed CATV (cable television). Several demonstrations of waveguide-laser and fiber-laser technology have been discussed in the literature. One primary advantage of solid-state waveguide lasers is that they offer the possibility for arrays of lasers operating on many wavelengths on a single glass chip. Rare-earth-doped waveguide lasers can also provide kilohertz linewidths with high radiance, low noise, and easy coupling to optical fibers.

In some embodiments, single-transverse-mode waveguides at 1535 nm wavelength were fabricated in a commercially available phosphate alkali glass that was co-doped with $0.99 \times 10^{20}$ $Er^{3+}$ ions/cm$^3$ and $3.97 \times 10^{20}$ $Yb^{3+}$ ions/cm$^3$. Phosphate glass is a very good host material for ytterbium and erbium ions since the sensitization efficiency is nearly unity and large doping concentrations are possible before the onset of concentration quenching. The guides were formed by ion exchange of $K^+$ for $Na^+$ using line apertures 3 to 8 $\mu$m wide etched in a 200 nm thick aluminum mask layer. The exchange time was 4 hours in an aluminum crucible containing molten $KNO_3$ at 375° C. Inspection of the samples using refractive near-field scanning after the ion exchange revealed that the regions of the glass surface corresponding to the location of the mask openings had become recessed by approximately 1 μm during the exchange process. The mechanism behind the etching of the glass during the exchange is currently under investigation, and it is thought that it is caused by residual water in the hygroscopic nitrate melt. The surface quality of the glass in the recessed regions, as observed using a 1000× Nomarski contrast microscope, appears identical to the original surface of the glass and apparently does not cause significant scattering losses.

In one embodiment, the length of the waveguides prior to the grating fabrication step was 2.2 cm. The waveguide end faces were polished perpendicular to the channels. Measurements of the waveguide mode-field dimensions showed that a single transverse mode was supported in each of the waveguides. For the guide formed with the 6.5 μm mask aperture, the 1/e full-widths of the mode-field intensity were 16 μm wide by 11 μm deep at 1.54 μm wavelength. It supported multiple transverse modes at the 977 nm pump wavelength. However, when the device was lasing, the pump energy was confined primarily within the lowest-order transverse mode, which had 1/e dimensions of 13 μm wide by 9.5 μm deep. All measurements of the intensity profile are within an estimated experimental error of ±10%.

In this embodiment, a DBR surface relief grating 230 was fabricated holographically in a 0.5 μm thick layer of Shipley 1805 photoresist using a 90° corner that split a collimated laser beam into two beams. The corner was mounted on a rotation stage so that the angle of the two beams could be varied. One surface of the corner was a mirror, and the other surface was a vacuum chuck for holding the sample. Light from a 457.8 nm Ar-ion laser was spatially filtered by focusing through a 15 μm pinhole using a 20× objective lens. The beam was collimated using a 76 mm diameter lens with a 350 mm focal length. The exposure angle was set to write a grating with a pitch of Λ=507.8 nm. For a waveguide with estimated effective index of 1.515±0.003, this pitch should provide laser operation at λ= 1538.6 nm±3 nm. The exposure time for the photoresist was 18 s with 3.85 mW incident in each arm on the 0.44 cm² exposed region (0.8 cm long×0.55 cm wide). The grating was developed in undiluted Shipley CD-30 developer. During the development, the diffraction of light from a 632.8 nm HeNe laser was monitored. When the first-order diffracted power reached a peak, the grating was removed, rinsed, and dried.

Before the DBR grating was formed by transferring the photoresist pattern into the glass by Ar-ion sputtering, 40 nm of Cr was deposited on the surface with the specimen inclined 60° to the electron-beam evaporation source. Mounting the specimen in this way causes Cr to accumulate only on the tops of the grating lines and not in the grooves, thus providing a durable etch mask that will perform better in the Ar-ion sputtering step. The grating was etched in the glass for 20 minutes using a reactive ion etching system with a 6.67 Pa (50 mTorr) Ar-ion plasma. The low-pressure plasma created a large self-bias voltage of 1700 V when running at 365 W of coupled power with frequency 13.5 MHZ. The electrode spacing was 3.2 cm. After etching, the sample 200 was cleaned ultrasonically in photoresist stripper at 85° C. In one such embodiment, a 5 minute rinse in TCE (trichloroethylene), is followed by a 5 minute rinse in acetone, and then followed by a 5 minute rinse in TCE methyl alcohol.

FIG. 1-A1 is an illustration of the completed DBR laser array.

The waveguide laser cavities 202 were formed by placing a thin, highly reflecting (R=99.9% at 1540 nm, R=15% at 977 nm) dielectric mirror 240 on the pump input facet. The mirror 240 was held in place by a spring clip, and index-matching fluid was used between the mirror 240 and the waveguide facet. The DBR grating 230 was used as the laser output coupler. The laser 202 was tested by coupling light from a Ti:$Al_2O_3$ laser tuned to a wavelength of 977 m using a 4× objective lens with a numerical aperture of 0.1. The launching efficiency was estimated to be between 65 and 71 percent. To determine the launching efficiency we measured the Fresnel reflectance of the input mirror, the loss of the launching objective, and the excess coupling loss.

FIG. 1-A2 shows the laser output power as a function of launched pump power and the spectrum of the laser. The waveguide diffusion aperture for this waveguide was 8 μm. The slope efficiency as a function of launched pump power is calculated to be 26 percent when we take the coupling factor to be 71 percent.

The reflectance of the grating was estimated using the simplified laser formula derived from the theory of Rigrod:

$$\frac{P_1}{P_2} = \frac{1-R_1}{1-R_2}\sqrt{\frac{R_2}{R_1}}$$

where $P_1$ is the output power at the grating end and $P_2$ is the output power at the end opposite the grating. $R_1$ is the grating reflectance and $R_2$ is the reflectance of the attached mirror. Two mirrors were used with reflectances of 80 and 90 percent for $R_2$. For both cases the grating reflectance, $R_1$, was calculated to be 65 percent.

To investigate the longitudinal mode structure of the laser, the laser output was coupled into an optical fiber scanning Fabry-Perot interferometer with a free spectral range of 124 GHz.

FIG. 1-A3 shows that the laser operated on a single longitudinal mode when the coupled pump power did not exceed 300 mW. The laser was robustly single frequency with TE polarization, and no mode hopping was observed. The inset in FIG. 1-A3 shows that a second longitudinal mode appeared when the coupled pump power exceeded 300 mW. In this pump regime, the laser was unstable and exhibited mode hopping, single-frequency operation, and dual-frequency operation. By measuring the frequency spacing between the longitudinal modes, the physical length of the laser cavity was determined to be 1.4 cm.

The linewidth of the laser was measured using a conventional self-heterodyne configuration with a 75 MHZ frequency shift. The path length difference between the two arms was 10 km corresponding to a linewidth resolution limit of 30 kHz for a Gaussian line shape. Optical isolators were used in both arms to prevent optical linewidth narrowing due to feedback; however, the output end of the laser was not beveled.

FIG. 1-A4 shows the self-heterodyne spectrum. The laser linewidth obtained from this measurement was 500 kHz.

Finally, the laser wavelengths of other waveguides on the chip were measured using an automatic spectrum analyzer with a resolution of 0.1 nm. Seven of the eleven waveguides on the chip exhibited laser oscillation. The waveguides formed through the smaller apertures did not achieve threshold because the smaller mode volumes caused a reduction of the gain such that the 45 percent transmittance loss of grating could not be overcome.

FIG. 1-A5 shows the change in wavelength trend as the waveguides were scanned. The wavelength increases as the diffusion aperture width increases, which is consistent with increasing effective index as the aperture width increases.

This example has demonstrated an array of high power, robustly single-frequency, integrated, DBR waveguide lasers operating near 1536 m wavelength. The slope efficiencies of the lasers are 26 percent based on launched pump power, and the threshold is less than 50 mW when pumped at a wavelength of 977 nm. The linewidths of the lasers were measured to be 500 kHz, and the outputs were linearly polarized in a TE mode. The temperature stability of the lasers and the relative intensity noise (RIN) are currently being investigated. It is expected that with diode laser pumping, the RIN will be similar to other results presented for single-fluency fiber lasers and will fall below −150 dB/Hz above 10 MHZ. It is anticipated that the output power and efficiency will increase and the threshold power will decrease when the grating reflectance is increased. This is possible with only minor adjustments to the grating fabrication process. Further improvements will also be realized by directly coating the high reflector onto the waveguide end facets. It has been shown that lasers with several output wavelengths can be integrated on a single glass substrate. This example shows that stable, multi-wavelength, WDM sources with wavelengths falling on the International Telecommunications Union (ITU) grid can be realized by writing several gratings of varying period in Yb/Er-co-doped glass waveguides formed by ion exchange.

EXAMPLE B

Compact solid-state lasers based on the 1.5 $\mu$m $Er^{3+}$ transition hold promise as sources for optical fiber communication systems. $Yb^{3+}$ is commonly used as a sensitizer in $Er^+$ lasers because it has a much larger absorption cross section near 980 nm than $Er^{3+}$, and it efficiently transfers its excited state energy to the upper level of the $Er^{3+}$ laser. The $Er^+/Yb^{3+}$ glass waveguide laser, in particular, has several advantages over lasers in $Er^+$-doped or $Er^+/Yb^{3+}$-co-doped glass fiber and bulk crystalline or glass hosts. Ion-exchanged waveguides can be fabricated in glasses with large ytterbium concentrations (approximately 5–15%) which allows the devices to be substantially shorter than fiber lasers. This results in lower polarization and output power noise, caused by thermal and mechanical stress-induced birefringence, and a smaller device volume. Short (approximately 1–2 cm) laser cavities are also of interest because of the potential for realizing high-pulse-repetition rate (GHz), passively mode-locked lasers. Unlike bulk devices, waveguide lasers can be designed to operate in a single transverse mode independent of the operating power or pump laser transverse mode profile, and do not require the alignment of bulk mirrors. In addition, the mode field sizes in waveguides can be designed to closely match those of optical fiber for efficient coupling with fiber optic systems. One disadvantage of $Er^{3+}/Yb^{3+}$ glass waveguide lasers, up to this point, has been the relatively low output powers (up to a few milliwatts) available from these devices. Increased output power will greatly expand the utility of these devices. A cw $Er^{3+}/Yb^{3+}$-co-doped phosphate glass waveguide laser which has produced 168 mW of output power at around 1540 nm for 611 mW of launched pump power at 979 nm has been described.

Waveguides were fabricated in a commercially available phosphate glass. The glass was co-doped with 1.15 wt % $Er_2O_3$ ($0.99 \times 10^{20°}$ ions/cm$^3$) and 4.73 wt % $Yb_2O_3$ ($3.97 \times 10^{20}$ ions/cm$^3$). Waveguides were formed by $K^+$—$Na^+$ exchange through a 200 nm thick Al mask layer with channel apertures ranging from 3 to 8 $\mu$m in width. The exchange occurred in a $KNO_3$ melt at 375° C. for 4 hours in an Al crucible. The laser results reported here are for a 6.5 $\mu$m wide mask aperture. Inspection of the samples after the ion exchange process revealed that the regions of the glass surface corresponding to the location of the mask openings had become recessed by one to two microns during the exchange process. The widths of the etched channels were close to the widths of the mask apertures and uniform in width and depth.

In one embodiment, the refractive index as a function of position within the exchanged sample was analyzed using a refractive near-field scanning method.

FIG. 1-B1 shows the index depth profile at the center of the waveguide formed with the 6.5 $\mu$m mask aperture for a wavelength of 633 nm. This method allows the relative position and absolute index values to be determined with an accuracy of 0.7 $\mu$m and 0.001, respectively.

In one embodiment, the transverse modes of the waveguides were characterized by coupling light at the wavelength of interest into one end of the waveguide and imaging the light emerging from the other end onto a calibrated infrared camera. The uncertainty of the mode dimensions determined using this method are approximately 10%. The device supported a single transverse mode at 1.54 $\mu$m having dimensions of 14.5 $\mu$m wide by 7.5 $\mu$m deep (measured at the 1/e points). The waveguide supported multiple transverse modes at 980 nm. However, when the device was lasing, the pump energy was confined primarily within the lowest order transverse mode which had dimensions of 6.4 $\mu$m wide by 3.6 $\mu$m deep.

In one embodiment, the device was pumped with a $Ti^{3+}$:sapphire laser. The waveguide laser cavities were formed by placing thin dielectric mirrors on the polished waveguide end faces. The mirrors were held in place by small spring clips, and index matching oil was used between the mirror and waveguide end face to reduce losses. The pump laser was launched through one of the mirrors with a 4× microscope objective. The laser output and unabsorbed pump were collimated with a 16× microscope objective and separated using filters. The laser cavity was 20 mm in length. The mirror through which the pump was launched had reflectivities of >99.9% and 15% at 1536 and 980 nm, respectively. The output coupler had a reflectivity of 80% at 1536 nm and transmitted 85% of the incident pump power. Neither the waveguide length nor the cavity output coupling has been optimized. The launching efficiency was estimated to be ≦71%, including losses due to the transmission of the input mirror and launching objective. The laser output power characteristics for two different pump wavelengths are illustrated in FIG. 1-B2. When pumped at 979 nm, the launched pump power threshold was 51 mW. A maximum output power of 168 mW was obtained for 611 mW of launched 979 nm pump power. A lower threshold could be obtained by tuning the pump laser off of the $Yb^{3-}$ absorption peak. For a pump wavelength of 960 nm, the threshold was 23 mW. The slope efficiency for both pump wavelengths was approximately 28%.

Using the broad-band cavity described above, the $Er^{3+}/Yb^{3+}$ laser usually operated at several wavelengths simultaneously. A typical laser spectrum showing simultaneous operation at 1536.0, 1540.7, and 1544.8 nm is depicted in FIG. 1-B3. The wavelength(s) of operation could be shifted by passing some of the collimated 1.5 $\mu$m laser output through a prism and reflecting it back through the prism and into the waveguide using a dielectric mirror. This formed a weakly coupled, external cavity. By rotating the prism, it was possible to produce wavelengths ranging from 1536 to 1595 nm.

A common feature of many three-level, rare-earth lasers is sustained relaxation oscillations which can be caused by small fluctuations in the pump laser power. Fluctuations in output power at frequencies ranging from approximately 0.5 to 1.5 MHZ were observed in this laser. The amplitude of the fluctuations decreased with pump power.

FIG. 1-B4 shows the output power as a function of time for pump power levels just above threshold and 9.4 times threshold. At the low pump power, the output power fluctuations of approximately 30% (peak to peak) of the average power were observed. At the high pump power, the fluctuations decreased to approximately 5% (peak to peak) of the average power. The $Ti^{3+}$:sapphire pump laser exhibited output power fluctuations of approximately 2–3%. Using a diode laser as the pump source should result in much quieter operation of the Er+laser.

Output powers exceeding 160 mW at 1.5 $\mu$m are now available from glass waveguide lasers fabricated using a simple thermal ion exchange process. Improvements in the waveguide fabrication process to optimize the waveguide geometry (such as incorporating a field-assisted ion exchange and fabricating buried waveguides), as well as adjustments in the cavity length and coupling, should improve the performance of these devices.

EXAMPLE C

Waveguide lasers and amplifiers in glasses codoped with $Er^+$ and $Yb^{3+}$ are promising candidates for compact multifunctional devices operating near 1.5 $\mu$m. The large gain bandwidth resulting from the inhomogeneously broadened glass host makes these devices ideal for narrow-line sources useful in wavelength division multiplexing applications. In addition, due to the short cavity lengths, these waveguide lasers offer high repetition rate (GHz) mode-locked lasers using semiconductor saturable absorbers. Such lasers are ideal as sources for soliton communications systems. Other applications requiring an eye-safe wavelength, such as remote sensing and range finding, could benefit from compact, high power continuous-wave (cw) or Q-switched waveguide laser sources based on these materials. Additionally, optical amplifiers offering gain in the range of 1530 to 1550 nm are realized for some embodiments of the present invention.

It is known that the $Er^+$ concentration must be kept relatively low (approximately 1 wt %) in these devices in order to reduce the deleterious effects of cooperative upconversion. However, the concentration of sensitizing $Yb^{3+}$ is not limited due to any ion-ion interaction, and is expected to have a significant effect on device performance. Various authors have investigated this problem theoretically. This example reports experimental results for waveguide lasers fabricated by K+— $Na^+$ ion exchange in silicate glasses with $Yb^{3+}$:$Er^{3+}$ ratios of 3:1, 5:1, and 8:1. In addition, we show how it is possible to increase the signal mode volume and optimize the pump-signal overlap through judicious choice of laser host material and ion exchange processing parameters. The result is an $Er^{3+}/Yb^{3+}$ waveguide laser producing as much as 19.6 mW at 1.54 $\mu$m with 398 mW of launched pump power at 974.5 nm.

The devices were fabricated in a commercially available laser glass. The glass is a phosphorus-free, mixed-alkali, zinc-silicate glass. Nominally, all three glasses were doped with 1 wt % (one percent by weight) $Er_2O_3$ ($0.85 \times 10^{20}$ $cm^{-3}$) and the glasses designated NIST10A, NIST10C, and NIST10E contain $Er^{3+}$:$Yb^+$ ratios of 3:1 ($2.47 \times 10^{20}$ $Yb^{3+}$ ions $cm^{-3}$), 5:1 ($4.16 \times 10^{20}$ $cm^{-3}$), and 8:1 ($6.83 \times 10^{20}$ $cm^{-3}$), respectively. The results reported were obtained by ion exchange through 3 $\mu$m apertures in 150 nm thick Al mask layers. The ion exchange was carried out in a melt of 100% $KNO_3$ for 14 hours at 400° C.

The optical modes of the waveguides at the signal wavelength were evaluated by coupling a 1.5 $\mu$m LED into a waveguide while the output was imaged onto an infrared camera. The waveguides supported a single transverse mode of dimensions 20.5±2.1 $\mu$m wide by 11.5±1.2 $\mu$m deep (measured at the 1/e points) at the signal wavelength. Since the host glass is a mixed alkali glass which contains potassium, the introduction of additional potassium by the ion-exchange process leads to a very small index change. As a result, the optical mode is not tightly confined. Although the waveguides supported multiple transverse modes at the pump wavelength, an examination of the pump mode while the device was lasing showed that only the lowest-order mode was excited. The result is excellent overlap between the pump and signal modes. The pump mode measured 15.2±1.5 $\mu$m wide by 7.0±0.7 $\mu$m deep.

Waveguide losses were estimated at 860 nm, away from the broad $Yb^{3+}$ absorption peak. Cutback measurements performed on samples prepared identically to the laser sample indicated an average waveguide loss of 0.25±0.11 dB/cm for NIST10A, 0.32±0.08 dB/cm for NIST10C, and 0.66±0.12 dB/cm for NIST10E. The coupling efficiency for the pump light was determined by measuring the pump throughput at 860 nm and correcting for losses from the input and output optics, as well as waveguide loss using the above-reported loss figures. Coupling efficiencies typically fell between 50% and 70%. The coupling efficiency was assumed to be identical at 860 nm and 975 nm.

For laser characterization, dielectric mirrors were attached to the polished end facets of the waveguide laser sample with index matching fluid and held in place by a small clip. The input mirror had a reflectance at 1536 nm of 99.9% and a transmittance at the pump wavelength of >90%. Various output couplers with reflectances ranging from 60 to 98% were used. All output couplers were also transmissive at the pump wavelength. The waveguide devices were pumped by a Ti:sapphire laser operating at 974.5 nm, which is the peak of the $Yb^{3+}$ absorption spectrum in this glass host. Pump light was coupled into the waveguide with a 4× (0.10 NA) microscope objective, and the output signal light was collected by a 20× objective. For signal power measurements, the output from the waveguide was focused onto an InGaAs power meter.

The laser performance was investigated as a function of device length as well as output coupler reflectance. FIG. 1-C1 shows a plot of laser signal power vs. launched pump power for two different output couplers, for a 1.68 cm long device fabricated in the glass with 5 $Yb^{3+}$ per $Er^{3+}$ ion. The slope efficiencies and laser thresholds were determined by fitting a line to the laser data. The lowest threshold was achieved when using a 98% reflector as output coupler. This device lased with a launched pump power threshold of approximately 59 mW. The slope efficiency of this device was 2.0% with respect to launched pump power. The highest slope efficiency was realized with a 70% reflector used as an output coupler. In this case, a slope efficiency of 6.5% was achieved with a launched pump power threshold of 86 mW. For a launched pump power of 398 mW, this laser produced 19.6 mW of output power.

A plot of slope efficiency vs. output coupler reflectance for each host glass appears in FIG. 1-C2. Data for device lengths in each glass which were experimentally determined to give the highest slope efficiency are plotted. Highest slope efficiency performance in each host is also compared in Table 1.

TABLE 1

Performance data for highest slope efficiency devices fabricated in IOG10 silicate glass with different $Yb^{3+}$:$Er^{3+}$ dopant ratios.

| $Yb^{3+}$:$Er^{3+}$ | Device length (cm) | Output coupler reflectance (%) | Slope efficiency (%) | Launched pump threshold (m/W) | Output with 400 MW pump (mW) |
|---|---|---|---|---|---|
| 3:1 | 1.80 | 80 | 5.2 | 52 | 17.9 |
| 5:1 | 1.68 | 70 | 6.5 | 86 | 20.4 |
| 8:1 | 1.42 | 70 | 5.0 | 238 | 8:1 |

The experimental results indicate that the optimal dopant ratio is close to 5 $Yb^{3+}$ for each $Er^{3+}$. Increasing the dopant ratio from 3:1 to 5:1 leads to an improvement in slope efficiency. Further increasing the dopant ratio to 8:1 does not improve the efficiency of the device, but does lead to a substantial penalty in pump power requirements. Recent efforts have been directed toward expanding the above results using a rigorous scalar model. In addition, alteration of the potassium content of the host glass is being investigated as a way to adjust the modal volume and decrease pump threshold requirements.

Some Unique Aspects of the Example Embodiments

The present invention provides the first demonstration of a monolithic single-frequency waveguide laser in a spectroscopically superior phosphate glass, and provides predictable emission wavelength if effective index of the waveguide is known. Embodiments of the invention as described above provide a high-power laser up to 80 mW (previous state-of-the-art in phosphate glass was 5 mW by D. Barbier, et al. at Conference on Optical amplifiers and applications, 1995, and for an Er-doped DBR laser was approximately 2 mW by Technical University of Denmark Microelectronic Centret using sputter-deposited silica doped with Er), a very high-slope efficiency laser of 26% (previous state-of-the-art in phosphate glass was 16% by D. Barbier, et al. at Conference on Optical amplifiers and applications, 1995, and about 11 percent by Yeniay, et. al., Lehigh University & Lucent), and a uniquely high-coupling efficiency of pump light from optical fiber as enabled by the low index change caused by the potassium-sodium ion-exchange process used in forming the waveguides.

One embodiment provides making the photoresist grating by evaporation of a chromium coating with the sample inclined 60 degrees to the normal of the evaporation source beam. This results in a hard metal coating on the tops of the photoresist bars that constitute the grating, thus allowing a more selective sputter etch of the grating and the use of higher DC bias voltages.

One embodiment provides a DBR grating exposure in standard photoresist using an optical phase mask. Another embodiment provides a uniquely high diffraction efficiency of photoresist grating by actively monitoring during photoresist developing to optimize diffraction efficiency and to ensure proper resist development. Also, etching of the grating by Ar-ion sputtering in a standard reactive-ion-etching system results in no CFC (chlorinated fluorocarbon) emissions as with reactive-ion-etching of silica glass. Using only argon gas at low pressure also provides a nearly sinusoidal grating without excess loss due to improved isotropic plasma etching. Isotropic etching in an argon ion plasma (the inert Ar ions come in at a range of angles rather than a single angle) also leaves a smooth surface (approximately sinusoidal) resulting in lower grating scattering losses.

In some embodiments, the effective index of refraction of one or more waveguides on a chip are measured before applying the grating, and a grating pitch (line spacing) is chosen to achieve the desired wavelength.

Further Embodiments and Improvements

As described above, some embodiments of the invention utilize a potassium-sodium ion-exchange process. In some situations, this process can result in the glass surface being etched significantly when exchange is done in an aluminum crucible. Accordingly, a further improvement provides a borosilicate (a.k.a. Pyrex) crucible for performing the ion exchange as opposed to an aluminum crucible. This has been found to greatly reduce the amount of surface attack and etching of the phosphate glass caused by the $KNO_3$ ion-exchange melt. As noted above, water content is also a factor in producing surface etching. Therefore, another embodiment provides an improved control of water content of melt by baking the $KNO_3$ at a temperature of at least approximately 120° C. for a period of 24–48 hours in an inert argon atmosphere.

Another factor involved in surface etching is due to oxidation reactions occurring during the ion-exchange process. Accordingly, in another embodiment, the crucible containing the molten ion-exchange solvent together with the substrate is placed inside a fully enclosed and sealed chamber (containing an inert atmosphere such as argon) during the ion-exchange process.

In another particular embodiment of the invention, the waveguides are buried within the substrate. This not only results in reduced scattering losses in the waveguide, but also largely avoids the corrosive effects that are another factor in surface etching. In this embodiment, the surface of the glass substrate is covered by a deposited titanium mask with narrow (about 2–5 microns in width) photolithographically applied apertures used to locally control the ion-exchange process. The waveguides are first formed just beneath the substrate surface by immersing the substrate, at an elevated temperature, in a molten salt bath of potassium nitrate. Diffusion of K ions from the solvent into the substrate through the mask apertures in exchange for Na ions results in a channel being formed with a higher refractive index believed due to the higher electronic polarizability of the K ions relative to Na as well as a possible stress effect. The surface waveguides thus formed are then buried below the substrate surface by a second, electric-field-assisted ion-exchange using molten sodium nitrate as an ion source. An electrode immersed in a sodium-nitrate bath is used to carry out the electric-field-assisted diffusion of Na ions into the substrate which exchanges for K ions diffused in the previous step. This has the effect of causing further diffusion of K ions of the waveguides deeper into the substrate, covering the waveguides with a lower refractive index material due to the Na ions diffused into the substrate surface. This also gives the waveguides a roughly oval or circular cross-section which minimizes surface scattering losses. The use of K diffusion (as opposed to diffusion with a more mobile element such as Ag) to form the waveguides results in a stable structure that is able to be migrated deeper into the waveguide under the influence of the applied electric field.

Another embodiment provides a PVD (physical vapor depostion process) that includes electron beam or sputter deposition or CVD (chemical-vapor deposition) deposited $SiO_2$ buffer layer coating over the surface of optical chip 200 to reduce surface scattering losses from the surfaces of waveguides 220. It is also difficult to get standard photoresist to properly adhere to phosphate glass. It has been found that providing a 1–2 nm of sputter-deposited $SiO_2$ on the surface of the phosphate glass greatly improves adhesion of photoresist during processing.

One embodiment provides an ion-exchange process that results in a slightly buried waveguide with the highest index in the waveguide occurring slightly below the surface. This reduces scattering loss. Another embodiment provides a mode field shape and size that is optimized for laser operation using a field-assisted, ion-exchange process where the electric field is varied as a function of time.

In an Yb/Er doped waveguide laser, there are performance tradeoffs related to the Yb-doping concentration, the Er-doping concentration, and the Yb/Er-doping ratio. It has been generally thought that more Yb doping will result in better laser performance. An alternate approach to optimizing the amount of Er and the Yb/Er ratio involves evaluating the relative performance tradeoffs between Yb—Er cross-relaxation efficiency and the total number of inverted Er ions in the laser cavity.

An example of the doping selection process is as follows:

As more Yb is incorporated into a glass with a constant Er concentration, the average distance between Er ions and Yb ions decreases, thus causing a rise in the cross-relaxation efficiency of Yb—Er energy transfer. The disadvantage of this is that more of the pump power is absorbed in a shorter distance. The result is that less Er ions will be inverted in a certain length, thus there will be less gain available as well as additional reabsorption loss in the 3-level Er ion laser system. Laser performance will suffer. The penalty will be higher thresholds and lower slope efficiencies. To obtain the best possible performance, both the Yb—Er cross relaxation and the total number of inverted ions as a function of pump power must be optimized simultaneously. For one particular device, a 4:1 ratio of Yb/Er was chosen with an Er concentration of $1 \times 10^{20}$ ions/$cm^3$. The total doping concentration is constrained since the glass is doped by substitution of Yb and Er for Na, and the total doping concentration cannot exceed 10 wt %.

By adding feedback elements to the waveguides in the form of reflection gratings, a variety of laser structures can be obtained using a process in accordance with the invention. In one embodiment, many gratings can be formed by exposing the photoresist fabricated on each single glass chip of a wafer using a silica plate that has multiple pitch phase masks printed on it. Accurate linewidth control and control of differential linewidth can be provided using phase masks with more than one period on a single substrate. Another embodiment provides a laser wavelength that is selected by printing a single pitch grating over an array of optical waveguides with each waveguide in the array having a different refractive index. Still another embodiment provides a laser wavelength that is selected by fabricating a single pitch grating on an array of identical optical waveguides where each waveguide crosses the grating at varying angles.

Another embodiment of the invention relates to a multi-compositional glass substrate formed with regions of differing concentrations of the same or different dopants, which regions may be used to form complex integrated-optic structures. The glass substrate may be doped by a selected amount in certain regions with one or more optically active lanthanide species or a laser species (which may be a rare-earth element such as Er, a combination of Er and Yb, or Pr) and undoped in others in such a manner that allows the independent control of gain, loss, and absorption in various regions of the glass. In regions that are undoped, light of many wavelengths can propagate with virtually no loss, while in doped regions various wavelengths can be absorbed causing gain to occur at other wavelengths for creating laser amplifiers or resonators.

The optical devices integrated into the substrate may constitute both active and passive devices. Active devices such as laser amplifiers and resonators use the excited laser medium to amplify or generate light while passive devices such as filters, splitters, and waveguides use the substrate as a transmission medium. Passage of a light signal at a lasing wavelength through a doped region of the substrate results in absorption of the light by the laser species, however, unless the population inversion is maintained by pump light. In order to avoid loss of signal, the doped region must be pumped which adds to the energy requirements of the system. Whether the region is pumped or not, however, transmitting the light signal through a doped region also adds noise to the signal by amplified stimulated emission. The present invention overcomes these problems by providing an undoped region through which light signals can be transmitted and in which passive devices can be located. The undoped region can also provide a pathway by which pump light from an external source can be directed to laser amplifiers or resonators in the substrate without intervening absorption of the light by a laser or sensitizer species.

Another embodiment of the present invention is a waveguide laser that includes a waveguide defined within a glass substrate and a diode pump laser with an extended waveguide cavity for supplying pump light to the waveguide laser. FIG. 2A shows in an exploded view of the components of such a laser which includes a doped substrate S with a substrate waveguide W defined therein, and a diode pump laser DPL 2401 with its output facet abutted to an extended waveguide laser-resonator cavity EWC 2403. The substrate waveguide W 202 is again defined within the substrate as a region of increased index of refraction relative to the rest of the substrate. In one embodiment, the glass substrate is doped with one or more optically active lanthanides species that can be optically pumped, such as Er or a combination of Er and Yb, to form a laser medium. In the case of Yb/Er co-doped glass, pump light at 980 nm supplied to the laser medium results in laser output centered near 1536 nm. The aspect of the invention to be described here, however, can be used with other combinations of dopants require different pump light wavelengths and outputting laser light centered at another wavelength.

In accordance with the invention, the output facet of the diode pump laser DPL 2401 in FIG. 2A has an anti-reflection coating applied thereto and the extended cavity EWC 2403 abutted to the output facet 2402 so that the laser-resonator cavity of the diode pump laser includes the cavity EWC 2403. The diode pump laser in this example produces 980 nm light, and the cavity EWC 2403 is terminated with a reflective element R1 that reflects at a wavelength centered near 980 nm. As shown in FIG. 12F2, in the operational device, the extended cavity EWC 2403 is positioned adjacent the waveguide W 202 to form a superstrate thereon. The cavity EWC 2403 includes a cladding layer CL interposed between the cavity and the waveguide W 202 that prevents pump light from uniformly leaking out of the cavity EWC 2403 and into the waveguide W 202. Instead, apertures AP are located in the layer CL that selectively leak pump light from the cavity EWC 2403 to the waveguide W 202. The apertures are placed so as not to interfere with the grating G 230 of the substrate wave guide 202. As pump light 2401 resonates within the extended diode laser cavity EWC 2403, a portion of the light is transmitted to the substrate waveguide W 202 along a portion of its length to cause lasing action therein. The diode pump laser 2401 cavity EWC 2403 in some embodiments has a lower index of refraction than the substrate waveguide and constitutes part of the cladding thereof. Pump light 2401 is thus transmitted to the substrate waveguide W 202, but laser light from the laser species within the substrate waveguide 202 is contained by the total internal reflection of the propagating mode due to the relatively higher refractive index of the substrate waveguide with respect to the substrate and diode pump laser cavity EWC 2403. In this embodiment, the substrate waveguide 202 and diode laser cavity 2403 are separated by a layer of interposed cladding having apertures AP defined therein for transmitting the pump light into the substrate waveguide 202 at selected locations. In another embodiment, the substrate waveguide 202 and diode laser cavity are separated by a gap at aperture AP with transmission of pump light into the substrate waveguide 202 occurring via evanescent coupling. In still other embodiments, the cladding layer CL may be fabricated as a resonant ARROW structure to produce the same effect. In one embodiment, end facet EF2 is highly reflective at pump wavelength 980 nm; end facet EF3 is highly reflective at output wavelength 1536 nm; end facet EF1 is anti-reflective at pump wavelength 980 nm; end facet EF4 is anti-reflective at output wavelength 1536 nm.

Figure 2B:
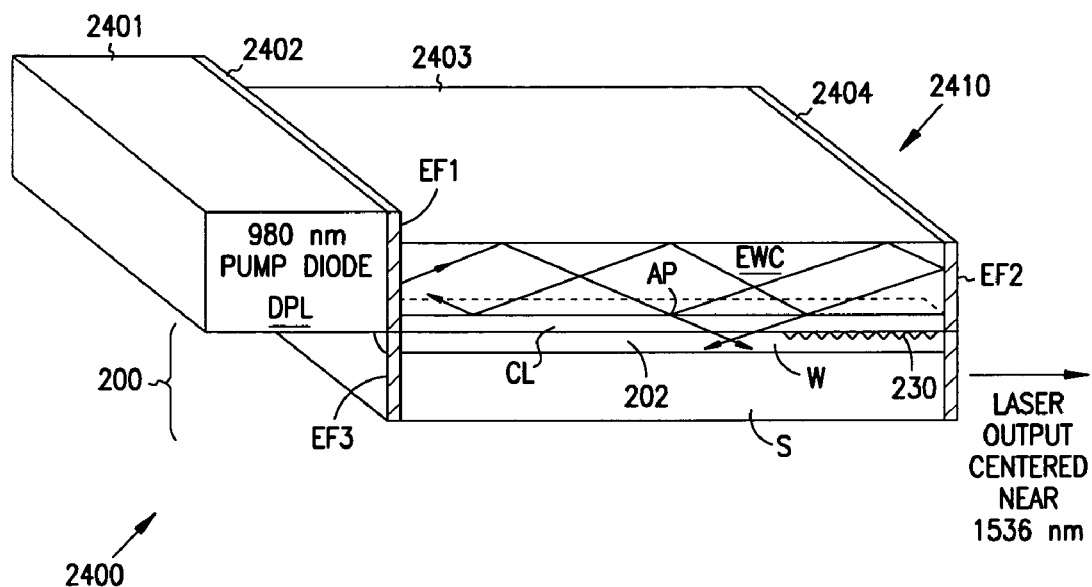
FIG. 2B shows the constructed view of a diode pumped laser in accordance with the invention.

In the embodiment shown in FIGS. 2A and 2B, reflective element EF3, (which may be mirrors or distributed Bragg reflection gratings) and grating G 230 are located along the substrate waveguide 202 for providing feedback in order to form a laser-resonator cavity within the waveguide W 202, with the grating G 230 made partially reflective for providing laser output. Other embodiments may omit the feedback elements EF3 and G to form a laser amplifier. Other possible modifications of this aspect of the invention include the use of a bulk optic component to couple light from the diode pump laser gain section to the extended cavity EWC, and the incorporation of grating stabilization of the diode pump laser via a distributed-feedback grating formed in the extended cavity EWC. Other embodiments include fabricating an amplifier section in place of the laser cavity 202.

The embodiment of the invention described with reference to FIGS. 2A and 2B thus presents an improvement over prior methods of cladding pumping of waveguide lasers and amplifiers. By using the diode pump laser cavity 2403 as a secondary cladding for the substrate waveguide W 202, as opposed to simply coupling the output of the diode pump laser 2401 to the secondary cladding, cladding pumping of very short (i.e., 1 cm or less) substrate waveguide lasers is thereby made possible. The configuration also permits mass production of a number of separate devices fabricated from a single superstrate formed on a single substrate having an array of waveguides defined therein.

Figure 3:
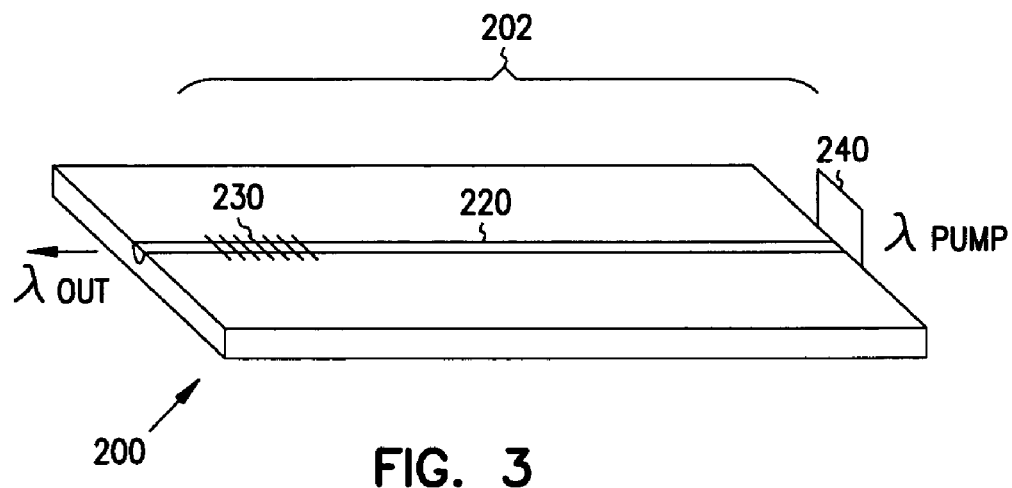
FIG. 3 shows an isometric view of an optical chip 200 having a laser 202 comprising waveguide 220, DBR mirror 230 and optional input mirror 240.
Figure 6:
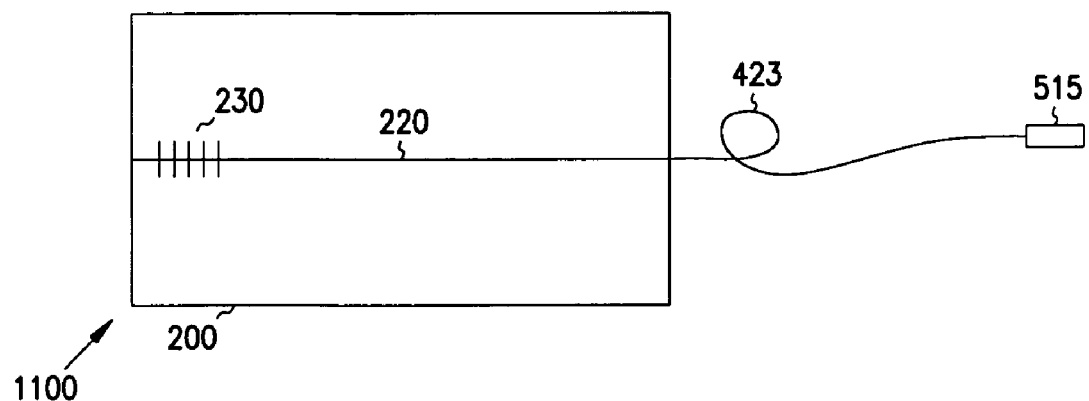
FIG. 6 shows a top view of a laser 1100 using a fiber coupling that includes an optical chip 200.

FIG. 3 shows an isometric view of an optical chip 200 having a laser 202 comprising waveguide 220, DBR mirror 230 and optional input mirror 240 according to one embodiment of the present invention. FIG. 6 shows more detail of a single laser 202 having an external launch mirror 240, which is transmissive at the pump light wavelength but highly reflective at the lasing wavelength of laser 202, and is used to launch the pump light into the laser cavity. Other embodiments include redundant waveguides all operating at a single wavelength, other waveguides 220 each having a DBR 230 tuned to a unique wavelength, or combinations thereof, all integrated on a single optical chip 200. In various embodiments, optical chip 200 of FIG. 6 is made with one of the configurations of FIGS. 2A–2B described above. In some embodiments, a plurality of operable lasers 202 are provided on each chip 200.

Figure 4:
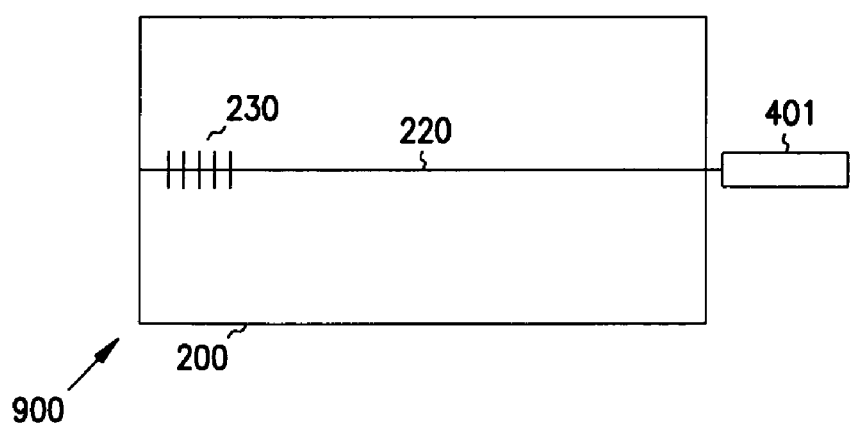
FIG. 4 shows a top view of a laser 900 using direct (butt) coupling that includes optical chip 200.

FIG. 4 shows a top view of a laser 900 using direct (butt) coupling of pump laser diode 310 to optical chip 200 according to one embodiment of the present invention.

Figure 5:
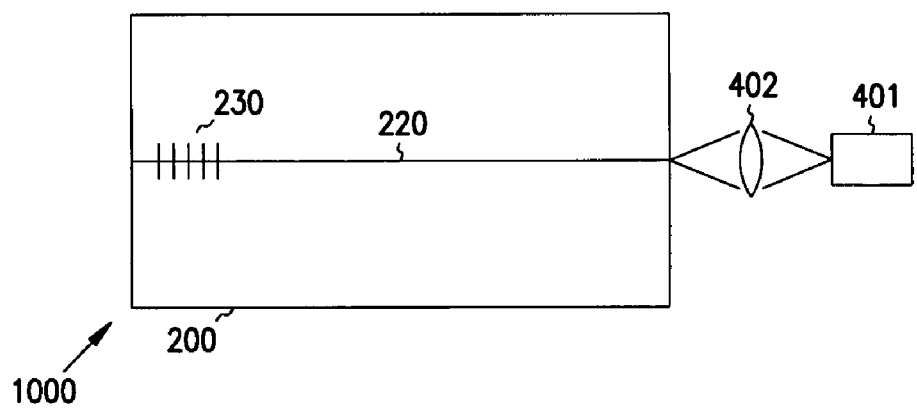
FIG. 5 shows a top view of a laser 1000 using lensed coupling that includes an optical chip 200.

FIG. 5 shows a top view of a laser 1000 using lensed coupling of pump laser diode 310 to optical chip 200 according to one embodiment of the present invention.

FIG. 6 shows a top view of a laser 1100 using a fiber coupling of pump laser diode 310 to optical chip 200 according to one embodiment of the present invention.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An optical component comprising:
   a glass substrate doped with a laser species;
   a substrate waveguide defined within the glass substrate, the substrate waveguide having an output facet; and
   a diode pump laser having a diode laser and a waveguide cavity abutted to an output facet of the diode laser to provide an extended waveguide cavity such that a laser resonator cavity of the diode pump laser includes the extended waveguide cavity, the extended waveguide cavity being positioned adjacent, above and along to a length of the substrate waveguide, the extended waveguide cavity coupled to the substrate waveguide so that pump light from along a length of the extended waveguide cavity of the diode laser's resonator cavity is transferred into the substrate waveguide along at least a portion of the length of the substrate waveguide to provide light from the output facet of the substrate waveguide.

2. The optical component of claim 1 wherein the substrate is doped with Yb and Er.

3. The optical component of claim 1 wherein the substrate is doped with Er.

4. The optical component of claim 1 wherein the substrate waveguide forms a laser resonator cavity within the substrate.

5. The optical component of claim 4 further comprising a reflection grating formed on the substrate surface along the substrate waveguide that provides feedback to the substrate waveguide's laser resonator cavity.

6. The optical component of claim 5 further comprising:
   a cladding deposited on the reflection grating of the substrate waveguide, the cladding being composed of an electro-optic polymer with a variable index of refraction; and electrodes for applying an electrical potential across the grating cladding to vary the index of refraction in accordance therewith and thereby vary the wavelength of light reflected by the grating.

7. The optical component of claim 5 further comprising electrodes and a resistive element for heating and thermally expanding the reflection grating of the substrate waveguide to alter the wavelength reflected by the grating.

8. The optical component of claim 5 further comprising electrodes for applying an electrical potential to a piezoelectric coating applied to the reflection grating to thereby vary the wavelength of light reflected by the grating.

9. The optical component of claim 5 wherein the reflection grating is composed of an electro-optic polymer and further comprising electrodes for applying an electrical potential across the grating to vary the index of refraction in accordance therewith and thereby vary the wavelength of light reflected by the grating.

10. The optical component of claim 5 further comprising:
one or more additional reflection gratings formed on the substrate waveguide, each grating having a cladding composed of an electro-optic polymer with a variable index of refraction deposited thereon; and
electrodes for selectively applying an electrical potential across each grating cladding to vary the index of refraction in accordance therewith and render the grating transparent or reflective at a wavelength corresponding to a longitudinal mode of the substrate waveguide laser cavity.

11. The optical component of claim 4 further comprising a mirror coupled to a location along the substrate waveguide for providing feedback to the substrate waveguide's laser resonator cavity.

12. The optical component of claim 1 wherein the extended waveguide cavity of the pump diode laser is a dielectric waveguide abutted at one end to an antireflection-coated gain section of the diode laser and at another end to a highly reflective mirror.

13. The optical component of claim 1 wherein the extended waveguide cavity of the pump diode laser is a dielectric waveguide abutted at one end to an antireflection coated gain section of the diode laser and at another end to a reflection grating.

14. The optical component of claim 1 wherein the extended waveguide cavity of the pump diode laser has a lower index of refraction than the substrate waveguide and forms part of a cladding thereof.

15. The optical component of claim 1 wherein the extended waveguide cavity is abutted to the surface of the substrate waveguide and separated therefrom by a layer of cladding with apertures for transmitting pump light into the substrate waveguide.

16. The optical component of claim 1 wherein the separation between the extended waveguide cavity and the substrate waveguide is such that pump light is transmitted by evanescent coupling.

17. A method for operating a waveguide optical component comprising:
providing a diode pump laser having a diode laser and a waveguide abutted to an output facet of the diode laser to provide an extended waveguide such that a laser resonator cavity of the diode pump laser includes the extended waveguide;
transmitting pump light from along a length of the extended waveguide of the diode pump laser resonator cavity into a substrate waveguide of the optical component along a length of the substrate waveguide, the extended waveguide cavity being positioned above and adjacent to the length of the substrate waveguide and positioned along the length of the substrate waveguide and coupled to the substrate waveguide.

18. The method of claim 17 wherein the substrate waveguide is composed of glass doped with Er and Yb and forms a laser cavity, with the diode laser and extended waveguide thereof being tuned to provide pump light at a wavelength appropriate to cause lasing in the substrate waveguide cavity.

19. The method of claim 17 wherein pump light from the extended waveguide of the diode pump laser is transmitted into the substrate waveguide via evanescent coupling.

20. The method of claim 17 wherein pump light from the extended waveguide of the diode pump laser is transmitted into the substrate waveguide through apertures in a layer of cladding material interposed therebetween.

21. The method of claim 17 wherein the substrate waveguide forms a laser cavity having a reflection grating at one end for providing optical feedback to the cavity and further wherein an electro-optic polymer having a variable index of refraction is deposited on the grating to form a cladding thereon, the method further comprising tuning the laser cavity by applying an electrical potential to the grating cladding to select a wavelength reflected by the grating that corresponds to a longitudinal mode of the substrate waveguide cavity.

22. The method of claim 17 wherein the substrate waveguide forms a laser cavity having a plurality of spaced apart reflection gratings at one end for providing optical feedback to the cavity and further wherein an electro-optic polymer having a variable index of refraction is formed on each one of the gratings to constitute claddings thereon, the method further comprising tuning the laser cavity by selectively applying an electrical potential to the grating claddings to render one grating reflective at a wavelength that corresponds to a longitudinal mode of the substrate waveguide cavity.

23. The optical component of claim 1, further comprising:
one or more additional waveguides defined within the substrate;
a diffraction Bragg reflector feedback element associated with each one of the plurality of waveguides for providing optical feedback to the respective waveguides to form respective laser-resonator cavities, wherein injection of pump light from the pump laser at one or more suitable wavelengths into each laser-resonator cavity causes output of laser light at a wavelength in accordance with a longitudinal cavity mode of the respective cavity,
wherein the respective laser-resonator cavities each have a different width selected from a plurality of widths on the substrate surface adjacent its associated diffraction Bragg reflector (DBR) to thereby define a plurality of different wavelengths.

24. The optical component of claim 23 wherein the laser-resonator cavities are fabricated in a plurality of groups, wherein the cavities in each group have a plurality of widths on the substrate surface adjacent a DBR to thereby define a plurality of different wavelengths defined at spaced-apart wavelength intervals, such that one cavity per group matches a standard wavelength associated with that group.

25. The optical component of claim 23 wherein each feedback element comprises a reflection grating formed on the substrate surface along the length of the waveguide and wherein a reflection grating of a single pitch is formed on the surface of the substrate at differing angles to a plurality of waveguides to form laser-resonator cavities of differing lasing wavelengths.

26. The optical component of claim 1, wherein the glass substrate comprises a block of glass having distinct regions doped with varying concentrations of one or more laser species, wherein the substrate is constructed by fusing together a plurality glass blocks having differing concentrations of the same dopants wherein at least one region is undoped, wherein at least a portion of the waveguide is located in an undoped region of the substrate.

27. The optical component of claim 1, wherein the glass substrate comprises a block of glass having distinct regions doped with varying concentrations of one or more laser species, wherein the substrate is constructed by fusing together a plurality glass blocks having differing concentrations of different dopants wherein at least one region is undoped, wherein at least a portion of the first waveguide is formed in an undoped region of the substrate.

28. The optical component of claim 1, wherein the glass substrate comprises a block of glass having distinct regions doped with varying concentrations of one or more laser species, wherein the substrate is constructed by fusing together a plurality glass blocks having differing concentrations of the same or different dopants, further comprising a laser amplifier fabricated therein, wherein the resonator and amplifier are formed in regions of the substrate with different dopant concentrations.

29. The optical component of claim 1, wherein the glass substrate comprises a block of glass having distinct regions doped with varying concentrations of one or more laser species, wherein the substrate is constructed by fusing together a plurality glass blocks having differing concentrations of the same or different dopants, the substrate further comprising a plurality of laser resonators fabricated therein, wherein the resonators are formed in regions of the substrate doped with different laser species so that lasing occurs within the resonators at different wavelengths.

30. The optical component of claim 1, further comprising:
a reflection grating along the substrate waveguide for providing feedback to the resonator cavity;
means for tuning the laser by altering the wavelength reflected by the grating, wherein the laser tuning means comprises:
a cladding deposited on the reflection grating of the substrate waveguide, the cladding being composed of an electro-optic polymer with a variable index of refraction; and
electrodes for applying an electrical potential across the grating cladding to vary the index of refraction in accordance therewith and thereby vary the wavelength of light reflected by the grating.

31. The optical component of claim 1, further comprising:
a reflection grating adjacent the substrate waveguide for providing feedback to the resonator cavity;
means for tuning the laser by altering the wavelength reflected by the grating, wherein the laser tuning means comprises:
one or more additional reflection gratings formed on the substrate waveguide, each grating having a cladding composed of an electro-optic polymer with a variable index of refraction deposited thereon; and
electrodes for selectively applying an electrical potential across each grating cladding to vary the index of refraction in accordance therewith and render the grating transparent or reflective at a wavelength corresponding to a longitudinal mode of the substrate waveguide laser cavity.

32. The optical component of claim 1, further comprising:
a reflection grating in the substrate waveguide for providing feedback to the resonator cavity;
means for tuning the laser by altering the wavelength reflected by the grating, wherein the laser tuning means comprises:
electrodes and a resistive element for heating and thermally expanding the reflection grating of the substrate waveguide to alter the wavelength reflected by the grating.

33. The optical component of claim 1, further comprising:
a reflection grating in the substrate waveguide for providing feedback to the resonator cavity;
means for tuning the laser by altering the wavelength reflected by the grating, wherein the laser tuning means comprises:
electrodes for applying an electrical potential to a piezo-electric layer applied to the reflection grating to thereby vary the wavelength of light reflected by the grating.

34. The optical component of claim 1, further comprising:
a cladding composed of an electro-optic polymer with an electrically variable index of refraction deposited on the waveguide;
electrodes for applying an electrical potential across the cladding to vary the index of refraction in accordance therewith and thereby vary the effective refractive index of the waveguide cavity.

35. The method of claim 17, wherein the laser cavity has a tunable reflection grating at one end for providing optical feedback to the cavity and further comprising:
applying an external voltage to the grating in order to change the wavelength of light reflected by the grating in accordance the applied voltage, the method further comprising tuning the laser by applying an electrical potential to the grating to select a wavelength reflected by the grating that corresponds to a longitudinal mode of the substrate waveguide cavity.

36. The method of claim 35 wherein the grating is coated with a cladding composed of an electro-optic polymer having a variable index of refraction such that application of a voltage to the cladding changes the wavelength of light reflected by the grating.

37. The method of claim 35 wherein the grating is composed of an electro-optic polymer having a variable index of refraction such that application of a voltage to the cladding changes the wavelength of light reflected by the grating.

38. The method of claim 35 wherein the grating is coated with a piezo-electric coating such that application of a voltage to the coating thereby varies the wavelength of light reflected by the grating.

39. The optical component of claim 1, wherein pump light from along a majority of the length of the extended waveguide cavity is transferred along a majority of the length of the substrate waveguide.

40. The method of claim 17, wherein pump light from along a majority of the length of the extended waveguide is transferred along a majority of the length of the substrate waveguide.

41. The method of claim 17, wherein the extended waveguide forms part of a lower refractive index cladding of the substrate waveguide.

42. An apparatus comprising:
a glass substrate doped with a laser species;
a substrate waveguide defined within the glass substrate, the substrate waveguide having an output facet; and
a diode pump laser having a diode laser and a waveguide abutted to an output facet of the diode laser to provide an extended waveguide, the extended waveguide formed as a cladding on the substrate, the extended waveguide being positioned adjacent to a length of the substrate waveguide and positioned along the length of the substrate waveguide and relative to the glass substrate disposed above the substrate waveguide, the extended waveguide coupled to the substrate waveguide so that pump light from along a length of the extended waveguide is transferred into the substrate waveguide along a length of the substrate waveguide to provide light from the output facet of the substrate waveguide.

43. The apparatus of claim 42 wherein the substrate waveguide forms a laser resonator cavity within the substrate.

44. The apparatus of claim 42 wherein the laser species includes Er and Yb.

45. The apparatus of claim 42 wherein the extended waveguide forms part of a laser resonator cavity of the diode pump laser.

* * * * *

UNITED STATES PATENT AND TRADEMARK OFFICE
CERTIFICATE OF CORRECTION

PATENT NO. : 6,970,494 B1
DATED : Novemer 29, 2005
INVENTOR(S) : Bendett et al.

It is certified that error appears in the above-identified patent and that said Letters Patent is hereby corrected as shown below:

<u>Column 18,</u>
Line 43, after "along" delete "to".

Signed and Sealed this

Twenty-third Day of May, 2006

JON W. DUDAS
*Director of the United States Patent and Trademark Office*